(12) United States Patent
Nishizawa et al.

(10) Patent No.: US 10,423,666 B2
(45) Date of Patent: Sep. 24, 2019

(54) WRITING METHOD AND SEMICONDUCTOR DEVICE INCLUDING A SEARCH MEMORY MAT WITH WRITE PROCESSING TERMINATED WHEN ONE PIECE OF DIVIDED KEY DATA IS SUCCESSFULLY WRITTEN

(71) Applicant: NAGASE & CO., LTD., Osaka (JP)

(72) Inventors: Masato Nishizawa, Tokyo (JP); Kaoru Kobayashi, Tokyo (JP); Kanji Otsuka, Tokyo (JP); Yoichi Sato, Saitama (JP); Toshiyuki Kouchi, Kanagawa (JP); Minoru Uwai, Kanagawa (JP)

(73) Assignee: NAGASE & CO., LTD., Osaka (JP)

( * ) Notice: Subject to any disclaimer, the term of this patent is extended or adjusted under 35 U.S.C. 154(b) by 0 days.

(21) Appl. No.: 15/574,690

(22) PCT Filed: Apr. 18, 2016

(86) PCT No.: PCT/JP2016/062291
§ 371 (c)(1),
(2) Date: Nov. 16, 2017

(87) PCT Pub. No.: WO2016/185849
PCT Pub. Date: Nov. 24, 2016

(65) Prior Publication Data
US 2018/0129756 A1 May 10, 2018

(30) Foreign Application Priority Data
May 18, 2015 (JP) .................. 2015-101082

(51) Int. Cl.
*G06F 16/903* (2019.01)
*G11C 15/04* (2006.01)
*G11C 8/12* (2006.01)

(52) U.S. Cl.
CPC .......... *G06F 16/90339* (2019.01); *G11C 8/12* (2013.01); *G11C 15/04* (2013.01);
(Continued)

(58) Field of Classification Search
CPC ......... G06F 16/90339; G06F 17/30982; G11C 8/12; G11C 15/04; G11C 15/046; Y02D 10/45; Y02D 10/13
See application file for complete search history.

(56) References Cited

U.S. PATENT DOCUMENTS 9,240,237 B2 * 1/2016 Otsuka .................. G11C 8/12
2004/0103236 A1 5/2004 Yoneda
(Continued)

FOREIGN PATENT DOCUMENTS

| JP | 2004-185792 | 7/2004 |
|---|---|---|
| JP | 5575997 | 7/2014 |
| WO | 2014/141566 | 9/2014 |

OTHER PUBLICATIONS

International Preliminary Report on Patentability for PCT/JP2016/066291, dated Jul. 19, 2016, 6 pages.*

*Primary Examiner* — Glenn Gossage
(74) *Attorney, Agent, or Firm* — Greenblum & Bernstein, P.L.C.

(57) ABSTRACT

A semiconductor device that writes, into respective memory spaces of a plurality of separate memories constituting a search memory mat, an entry address corresponding to key data to be written. In this semiconductor device, pieces of divided data are assigned respectively to the separate memories, and, by employing each divided data as an address, entry addresses corresponding to the divided data are written sequentially into memory spaces specified by memory addresses of the separate memories (first writing process). In this first writing process, if another entry address is already written in an accessed memory space, no entry address is
(Continued)

written into that memory space. If an entry address corresponding to a single one of the plurality of pieces of divided data is successfully written into a memory space, the first writing process is ended. Second write processing to a verification memory may also be performed. Key data may be written to a backup memory when a whole collision occurs. The semiconductor device may also include multiple encoding circuits using different algorithms, and a narrowing unit to narrow down entry address candidates.

13 Claims, 18 Drawing Sheets

(52) U.S. Cl.
CPC ............ *G11C 15/046* (2013.01); *Y02D 10/13* (2018.01); *Y02D 10/45* (2018.01)

(56) References Cited

U.S. PATENT DOCUMENTS

| | | | |
|---|---|---|---|
| 2008/0177909 A1* | 7/2008 | Sapp | G06F 13/28 710/27 |
| 2015/0070957 A1 | 3/2015 | Otsuka et al. | |

\* cited by examiner

Fig.16
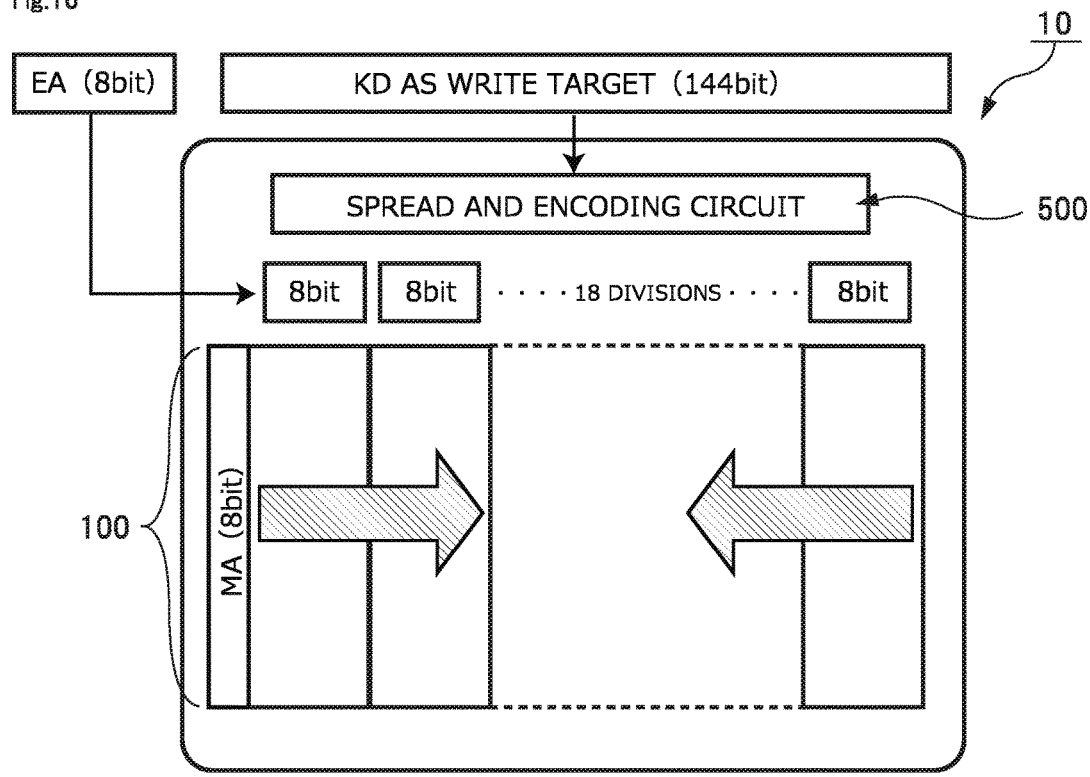
(1) 00_01_02_03_04_05_06_07_08_09_0A_0B_0C_0D_0E_0F_10_11
(2) 00_01_02_03_04_05_06_07_08_09_0A_0B_0C_0D_0E_0F_10_12
(3) 00_01_02_03_04_05_06_07_08_09_0A_0B_0C_0D_0E_0F_10_13
(4) 00_01_02_03_04_05_06_07_08_09_0A_0B_0C_0D_0E_0F_10_14

(1) 00_01_02_03_04_05_06_07_08_09_0A_0B_0C_0D_0E_0F_10_11
UPPER SIDE ⟶

(2) 00_01_02_03_04_05_06_07_08_09_0A_0B_0C_0D_0E_0F_10_12
⟵ LOWER SIDE (3) 00_01_02_03_04_05_06_07_08_09_0A_0B_0C_0D_0E_0F_10_13
UPPER SIDE ⟶

(4) 00_01_02_03_04_05_06_07_08_09_0A_0B_0C_0D_0E_0F_10_14
⟵ LOWER SIDE (1) 00_01_02_03_04_05_06_07_08_09_0A_0B_0C_0D_0E_0F_10_11

(2) 00_01_02_03_04_05_06_07_08_09_0A_0B_0C_0D_0E_0F_10_12

(3) 00_01_02_03_04_05_06_07_08_09_0A_0B_0C_0D_0E_0F_10_13

(4) 00_01_02_03_04_05_06_07_08_09_0A_0B_0C_0D_0E_0F_10_14

WRITING METHOD AND SEMICONDUCTOR DEVICE INCLUDING A SEARCH MEMORY MAT WITH WRITE PROCESSING TERMINATED WHEN ONE PIECE OF DIVIDED KEY DATA IS SUCCESSFULLY WRITTEN

TECHNICAL FIELD

The present invention relates to a semiconductor device, a method of writing an entry address to a semiconductor device, and a reading method thereof. To be more specific, the semiconductor device according to the present invention relates to a content addressable memory (CAM) and the like for reduction of power consumption at the time of writing or searching data.

BACKGROUND ART

Recently, high performance of Internet switches and routers and reduction of power consumption have become urgent issues along with the advent of the era of cloud computing. In addition, there is a demand for a search engine that can perform a reliable search operation with higher speed and lower power consumption as a search engine for the Internet. In order to respond to such a demand, a CAM has been frequently used in Internet switches and search engines in recent years.

Here, search data called key data is input to the CAM at the time of searching data stored in the CAM. Further, when the same data as the key data is stored in the memory, the CAM outputs an address of a memory in which the key data is stored. The address at this time is also called an entry address. In general, it is necessary to access the entire memory space in the CAM in order to implement such a search function so that there is a problem that not only the circuit configuration becomes complicated but also the power consumption increases. In particular, this problem that the power consumption increases becomes severe as the scale of the CAM increases, and thus, is considered an extremely serious problem now.

In response to such a problem, for example, Patent Literature 1 proposes a data retrieval device aiming at low power consumption while making full use of high-speed retrieval performance of a CAM. The data retrieval device of Patent Literature 1 newly orders a plurality of pieces of rule data of which priorities are determined according to the order of data size, and allocates the plurality of pieces of rule data to a plurality of memory blocks according to the order. In addition, this retrieval device executes a search processing by specifying one memory block that should be searched at the time of performing retrieval of data. In this manner, the data retrieval device of Patent Literature 1 activates only the specified single block and does not need to activate the other blocks at the time of performing the search processing, and thus, it is considered that it is possible to reduce power consumption during the retrieval as compared to the typical CAM by such amount.

Although the data retrieval device disclosed in Patent Literature 1 described above can reduce the power consumption during the retrieval as compared with the typical memory, it is necessary to access the entire memory space in the block at once in order to execute the search processing. For this reason, the conventional data retrieval device has a problem that the circuit configuration is complicated and the power consumption during the retrieval is great. In this manner, the above-described technique of Patent Literature 1 does not present a fundamental solution to the current problem.

Therefore, a novel semiconductor device (CAM) has been proposed by the present inventors in order to implement data search at high speed and low power consumption (Patent Literature 2). This novel CAM is provided with a search memory mat in which an entry address corresponding to key data is written in a memory space specified by a memory address and a control circuit connected to the search memory mat. In the search memory mat, the memory space is divided into a plurality of separate memories. When the key data for a write to the search memory mat is input to the CAM, the control circuit divides the key data into a plurality of pieces of divided data. Then, the control circuit allocates the plurality of pieces of divided data to the plurality of separate memories, respectively, and writes the entry address corresponding to the divided data in the memory space specified by the memory address of each of the separate memories using each piece of the divided data as an address. In this manner, the entry addresses corresponding to the plurality of pieces of key data are written in the search memory mat.

In addition, a process of searching the key data written in the search memory mat is performed with the same steps as the write processing. That is, when key data as search target data is input to the CAM, the control circuit divides the key data as the search target data into a plurality of pieces of divided data. Then, the control circuit accesses the memory space specified by the memory address of each separate memory using each piece of the divided data as an address, and reads the entry address corresponding to the divided data from the accessed memory space.

In this manner, the key data is divided into a plurality of pieces, and the entry addresses corresponding to each piece of the divided key data are stored in the separate memories in the novel CAM developed by the present inventors. Therefore, it is unnecessary to make active (activate) the entire search memory mat at once at the time of searching this entry address, and it is possible to perform the search and partially activate the search memory mat for each separate memory. Therefore, it is possible to execute data search with much lower power consumption than the conventional CAM while implementing the data search with the same high-speed performance as the conventional CAM, according to the CAM of the present invention.

CITATION LIST

Patent Literature

Patent Literature 1: JP 2004-185792 A
Patent Literature 2: Japanese Patent No. 5575997

SUMMARY OF INVENTION

Technical Problem

For the entire divided data obtained by dividing the key data, the CAM disclosed in Patent Literature 2 basically writes the entry addresses corresponding thereto in the memory space in the search memory mat, at the time of performing the write processing. For example, in the case of dividing 144 bits of key data into 8 bits of eighteen pieces of data, the CAM of Patent Literature 2 needs to write the entry addresses corresponding to the key data to the eighteen separate memories constituting the search memory mat, at the maximum. Meanwhile, all the entry addresses written to the eighteen separate memories are the same data in the CAM of Patent Literature 2. In this manner, it is necessary to write the same entry address to a plurality of locations at the time of writing one piece of key data to the search memory mat in the CAM of Patent Literature 2. Thus, the capacity of the memory space used for writing of one piece of key data becomes relatively large, and there is a problem that the number of pieces of key data that can be written in the search memory mat is not sufficient. In addition, there is a tendency that a size of the search memory mat increases in a writing method of the CAM of Patent Literature 2, and there is also a problem that it is difficult to reduce a size of the CAM.

Further, in order to write one piece of key data in the search memory mat in the CAM of Patent Literature 2, basically, it is necessary to divide this key data into a plurality of pieces of divided data, allocate all the plurality of pieces of divided data to the separate memories, and write the entry addresses corresponding thereto one by one. However, there is a problem that it takes a relatively long time to initially register a large number of pieces of key data when the process of writing the entry addresses corresponding to all of the plurality of pieces of divided data is performed.

In this manner, the CAM of Patent Literature 2 has an advantage that the process of searching the key data can be performed with extremely low power consumption, but it is considered that there is room for improvement in terms of the write capacity (search capacity), the memory size, the speed of the write processing, and the like.

Therefore, an object of the present invention is to provide a semiconductor device, such as a CAM, which is capable of implementing an increase in write capacity (search capacity), reduction in memory size, and an increase in speed of write processing while maintaining a low power consumption property in search processing.

Solution to Problem

The present invention has been made based on findings, basically, that it is possible to improve the efficiency in a process of writing key data to a search memory mat by configuring a device such that, when key data corresponding to one piece of divided data has been successfully written among a plurality of pieces of divided data divided from certain key data as a write target, the process of writing key data is not performed for the subsequent pieces of divided data. According to the present invention, it is possible to increase the write capacity (search capacity), and further, to implement the reduction in memory size and the increase in speed of the write processing. To be specific, the present invention has the following configurations and steps.

A first aspect of the present invention relates to a semiconductor device such as a CAM.

Referring to the Figures, the semiconductor device according to the present invention includes: a search memory mat 100; a control circuit 200; and a verification memory 300. The search memory mat 100 is a storage device in which an entry address (EA) corresponding to key data (KD) is written in a memory space specified by a memory address (MA). The control circuit 200 is connected to the search memory mat and performs processes of writing and reading data with respect to the search memory mat. The verification memory 300 is a storage device connected to the control circuit and is under the control of this control circuit.

In the search memory mat 100, the memory space is divided into a plurality of separate memories 110a, 110b, and so on.

The control circuit 200 includes an input unit 210 to which key data is input, a dividing unit 220 which divides the key data input to the input unit into a plurality of pieces of divided data, and a writing unit 230.

The writing unit 230 executes at least first write processing to be described below.

That is, the first write processing is a process of allocating each of the plurality of pieces of divided data divided by the dividing unit to the plurality of separate memories and sequentially writing the entry addresses corresponding to the divided data in the memory space specified by the memory address of the separate memory using the divided data as an address.

Here, when an entry address corresponding to another divided data has already been written in a memory space in which an entry address corresponding to certain divided data needs to be written in the first write processing, the writing unit 230 does not write the entry address in the relevant memory space.

Further, when an entry address corresponding to one piece of divided data has been successfully written in the memory space among the plurality of pieces of divided data, the writing unit 230 terminates the first write processing and does not perform the write processing for the subsequent pieces of divided data.

As described above, the semiconductor device according to the present invention terminates the first write processing and does not perform the write processing for the subsequent data when one entry address has been successfully written in the memory space for one piece of key data as the writing target. Thus, only one memory address is written in the memory space of the search memory mat in the process of writing a certain piece of key data. As described above, the plurality of memory addresses is written in the memory space of the search memory mat in the process of writing a certain piece of key data in the semiconductor device of Patent Literature 2. As compared with this, the semiconductor device according to the present invention can reduce the capacity of the memory space used in the process of writing one piece of key data. Accordingly, the present invention can increase the number of pieces of key data that can be registered in the search memory mat and increase the write capacity. In addition, the semiconductor device according to the present invention can efficiently utilize the memory space of the search memory mat, and thus, it is possible to reduce the size of the memory. Further, the semiconductor device according to the present invention terminates the write processing at a point in time of successfully writing one entry address in the memory space, and thus, it is possible to achieve the increase in speed of the write processing.

In the semiconductor device according to the present invention, the writing unit 230 preferably further includes the verification memory 300 connected to the control circuit 200. In this case, the writing unit 230 preferably further executes second write processing to be described below. That is, the second write processing is a process of writing key data input to the input unit 210 and an entry address corresponding thereto in the verification memory 300 in association with each other.

As described above, the key data as a write target and the entry address corresponding thereto are written in association with each other in the verification memory 300 by the second write processing of the writing unit 230. Accordingly, when a plurality of entry addresses is read from the search memory mat 100 in read processing to be described later, it is possible to determine which entry address is correct by referring to the verification memory 300.

The semiconductor device according to the present invention preferably further includes a backup memory 400.

In addition, when it is difficult to write the entry address corresponding to certain key data in the memory space for all of the plurality of pieces of divided data divided from the key data (when a "whole collision" occurs), the writing unit 230 preferably writes the key data and the entry address corresponding thereto in the backup memory 400 in association with each other.

As described above, the backup memory 400 is provided so that when the whole collision of the entry address is generated, the entry address corresponding to the whole collision and the key data are stored in the backup memory 400 in association with each other. As a result, it is possible to avoid a situation where it is difficult to write the entry address in the search memory mat. However, the probability of generation of the collision (whole collision) of the entry address in the search memory mat is relatively low since one entry address for one piece of key data is recorded in the search memory mat in the present invention. Incidentally, when the whole collision is generated in the write processing and key data is written in the backup memory 400, it is unnecessary to write the same key data in the above-described verification memory 300. That is, the key data may be written or not necessarily written in the verification memory 300 when writing the key data in the backup memory 400.

The semiconductor device according to the present invention preferably further includes an encoding circuit 500.

The encoding circuit 500 is a circuit that encodes key data input to the input unit 210 of the control circuit 200 based on a predetermined algorithm and inputs the encoded key data to the dividing unit 220.

As described above, the encoding circuit 500 can distribute a numerical value of the key data by encoding the key data. It is possible to reduce the probability of generation of the collision of the entry address in the memory space during the process of writing the entry address by distributing the value of the key data, for example, even when a plurality of pieces of key data having almost the same content is continuously input. As a result, it is possible to efficiently perform the process of writing the entry address.

The semiconductor device according to the present invention is preferably configured such that the above-described search memory mat 100 includes a first search memory mat 100a and a second search memory mat 100b (see FIGS. 14-15). In addition, the semiconductor device according to the present invention is preferably configured such that the above-described encoding circuit 500 includes a first encoding circuit 500a and a second encoding circuit 500b having mutually different encoding algorithms (again see FIGS. 14-15).

In this case, the writing unit 230 of the control circuit 200 first writes an entry address corresponding to key data encoded by the first encoding circuit 500a in the first search memory mat 100a. At the same time, the writing unit 230 of the control circuit 200 writes an entry address corresponding to key data encoded by the second encoding circuit 500b in the second search memory mat 100b.

As described above, the writing unit 230 writes the entry address corresponding to a certain piece of key data in at least both the first search memory mat 100a and the second search memory mat 100b. In this manner, the writing unit 230 performs mirroring write processing. Further, when writing certain key data in the first search memory mat 100a and the second search memory mat 100b, the writing unit 230 encodes (disperses) the key data with different algorithms using the first encoding circuit 500a and the second encoding circuit 500b. Accordingly, it is possible to further reduce the probability of generation of collision of the entry address in the memory space during the write processing of the entry address.

When performing the first write processing on first key data in the semiconductor device according to the present invention, the writing unit 230 first writes an entry address corresponding to k-th divided data among a plurality of pieces of divided data, obtained by dividing the first key data, in the memory space.

In this case, it is preferable that the writing unit 230 first writes an entry address corresponding to divided data other than the k-th divided data among a plurality of pieces of divided data, obtained by dividing the second key data, in the memory space when performing the first write processing on second key data.

As described above, the writing unit 230 varies the order of divided data to perform the write processing of the entry address, and thus, it is possible to efficiently utilize the memory space in the search memory mat. That is, if it is set such that the write processing of the entry address is started from the first divided data after dividing the key data as the write target into the plurality of pieces of divided data, the entry address is written into only the separate memory corresponding to this first divided data, and written areas of the memory space will be concentrated only on the separate memory corresponding to the first divided data. On the contrary, when dividing the key data as the write target into eighteen pieces, it is possible to efficiently and widely use the memory space by varying the order of the write processing, for example, by starting the write processing of the entry address from the first divided data for the first key data and starting the write processing of the entry address from the eighteenth divided data for the second key data.

The control circuit 200 of the semiconductor device according to the present invention further includes a reading unit 240 configured to read an entry address corresponding to key data when the key data as a search target is input.

When the key data as search target data has been input to the input unit 210 and the dividing unit 220 has divided the key data as the search target data into a plurality of pieces of divided data, the reading unit 240 accesses the memory space specified by the memory address of each of the separate memories using each piece of the divided data as an address. Then, the reading unit 240 reads the entry address corresponding to the divided data from the accessed memory space.

As described above, the reading unit 240 accesses the memory space of the separate memory using each piece of the divided data obtained by dividing the key data as the search target as the address, and reads the entry address stored in the accessed memory space. In this manner, it is possible to reduce the power consumption in the search processing since it is enough if only the necessary part is activated without activating all the memory spaces in the search memory mat.

The control circuit 200 of the semiconductor device according to the present invention further includes a verifying unit 250 for verifying whether or not the entry address read by the reading unit 240 is appropriate.

The verifying unit 250 first uses one or a plurality of entry addresses read by the reading unit 240 as a key to read key data corresponding to this entry address from the verification memory 300. Then, the verifying unit 250 verifies whether or not the key data read from the verification memory 300 in this manner is consistent with the key data as the search target data input to the input unit 210.

In the semiconductor device according to the present invention, when the writing of the entry address has succeeded for one piece of divided data, the writing of the entry address is not performed for the subsequent divided data upon performing the write processing of the entry address corresponding to the key data as described above. For this reason, it is assumed that a plurality of different entry addresses is read when the read processing of the entry address is performed by the above-described reading unit 240. When the plurality of different entry addresses is read in this manner, it is difficult to determine the entry address corresponding to the key data as the search target. Therefore, the verifying unit 250 is provided as described above to perform the process of verifying whether or not the key data corresponding to each of the entry addresses is consistent with the key data input as the search target by referring to the verification memory 300 for each of the plurality of entry addresses read by the reading unit 240. As a result, it is possible to uniquely determine the entry address that is consistent with the key data input as the search target.

In the semiconductor device according to the present invention, there is a case where the verifying unit 250 determines that the key data corresponding to all the entry addresses read by the reading unit 240 is not consistent with the key data as the search target data. In this case, the reading unit 240 preferably refers to the backup memory 400 to read an entry address corresponding to key data consistent with the key data as the search data from the backup memory 400.

As described above, when the whole collision of the entry addresses occurs in the write processing, the entry addresses corresponding to the whole collision and the key data are stored in the backup memory 400 in association with each other. For this reason, even when the verifying unit 250 determines "no consistency", there is a possibility that the key data consistent with the key data as the search data is stored in the backup memory 400. Therefore, it is preferable that the reading unit 240 refer to the backup memory 400 in such a case.

The semiconductor device according to the present invention preferably further includes a narrowing unit 270. When the plurality of entry addresses is read by the reading unit 240, the narrowing unit 270 narrows down an entry address candidate from the plurality of entry addresses and sends the entry address candidate to the verifying unit 250. Incidentally, the number of entry address candidates narrowed down by the narrowing unit 270 is smaller than the number of entry addresses read by the reading unit 240.

As described above, the plurality of entry addresses is sometimes read by the reading unit 240 in the read processing according to the present invention. In this case, it is possible to uniquely determine the entry address corresponding to the key data as the search target by collating the verification memory 300 for each of the plurality of entry addresses. However, there is a risk that delay in the read processing is caused by referring to the verification memory 300 one by one if there are a large number of entry addresses read by the reading unit 240. Therefore, the narrowing unit 270 is arranged between the reading unit 240 and the verifying unit 250. Then, a process of narrowing down a smaller number of candidates from the plurality of entry addresses read by the reading unit 240 is performed by the narrowing unit 270, and the narrowed entry addresses are sent to the verifying unit 250. As a result, the number of times of referring to the verification memory 300 performed by the verifying unit 250 decreases, and thus, it is possible to achieve an increase in speed of the search processing.

A second aspect of the present invention relates to an information writing method that is executed by the semiconductor device according to the first aspect.

The information writing method according to the present invention includes: a step of inputting key data to the control circuit 200; a step of causing the control circuit 200 to divide the input key data into a plurality of pieces of divided data; and a writing step.

In the writing step, a first write processing is performed in which the plurality of pieces of divided data thus divided is allocated, respectively, to the plurality of separate memories 110a, 110b, and so on, and entry addresses corresponding to the divided data are sequentially written in memory spaces specified by memory addresses of the separate memories 110a, 110b, and so on, using the divided data as addresses.

Here, when an entry address corresponding to another divided data has already been written in a memory space in which an entry address corresponding to certain divided data needs to be written in the first write processing, the entry address is not written in the relevant memory space.

Further, when an entry address corresponding to one piece of divided data has been successfully written in the memory space among the plurality of pieces of divided data in the first write processing, the first write processing is terminated.

In addition, in the writing step, it is preferable to further perform a second write processing in which the input key data and the entry address corresponding thereto are written in the verification memory 300 in association with each other.

A third aspect of the present invention relates to an information reading method of reading an entry address written in a semiconductor device 10 by the information writing method according to the second aspect described above.

The information reading method according to the present invention includes: a step of inputting key data as search target data to the control circuit 200; and a step of dividing the key data as the search target data into a plurality of pieces of divided data performed by the control circuit 200.

The information reading method according to the present invention further includes a step of accessing a memory space specified by a memory address of each of the separate memories 110a, 110b, and so on, using each piece of the divided data as an address and reading an entry address corresponding to the divided data from the accessed memory space performed by the control circuit 200. The information reading method according to the present invention further includes a step of reading key data corresponding to the read entry address from the verification memory 300, and verifying whether or not the key data read from the verification memory 300 is consistent with key data as search target data.

Advantageous Effects of Invention

According to the present invention, it is possible to implement the increase in write capacity (search capacity), the reduction in memory size, and the increase in speed of write processing while maintaining the low power consumption property in search processing.

BRIEF DESCRIPTION OF DRAWINGS

FIG. 16 illustrates a first modified example of the write processing.

DESCRIPTION OF EMBODIMENTS

Hereinafter, embodiments of the present invention will be described with reference to the drawings. The present invention is not limited to the embodiments described below, but includes amendments thereto made appropriately by those skilled in the art to the extent obvious.

Figure 1:
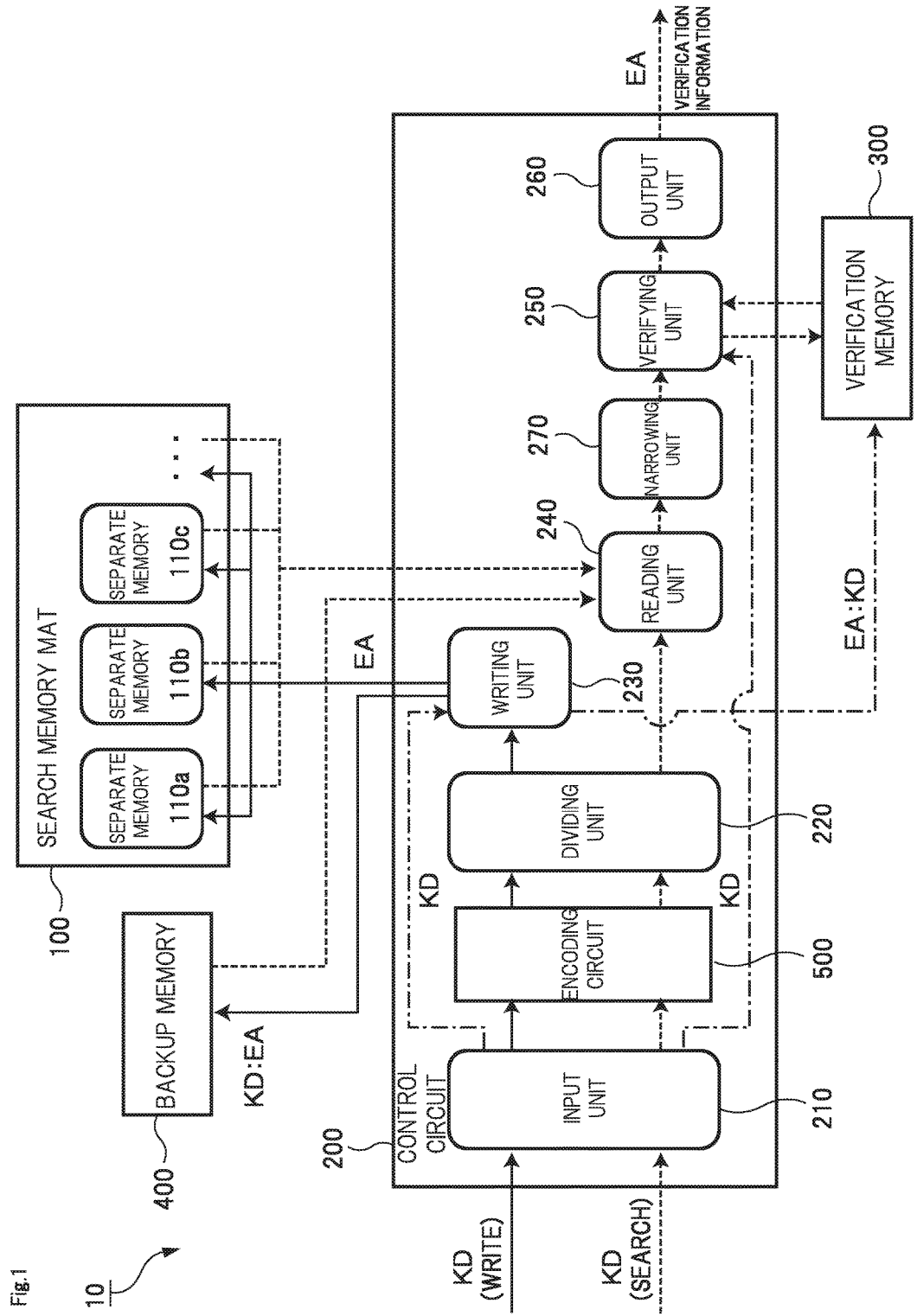
FIG. 1 illustrates a functional block of a semiconductor device according to the present invention.
Figure 2:
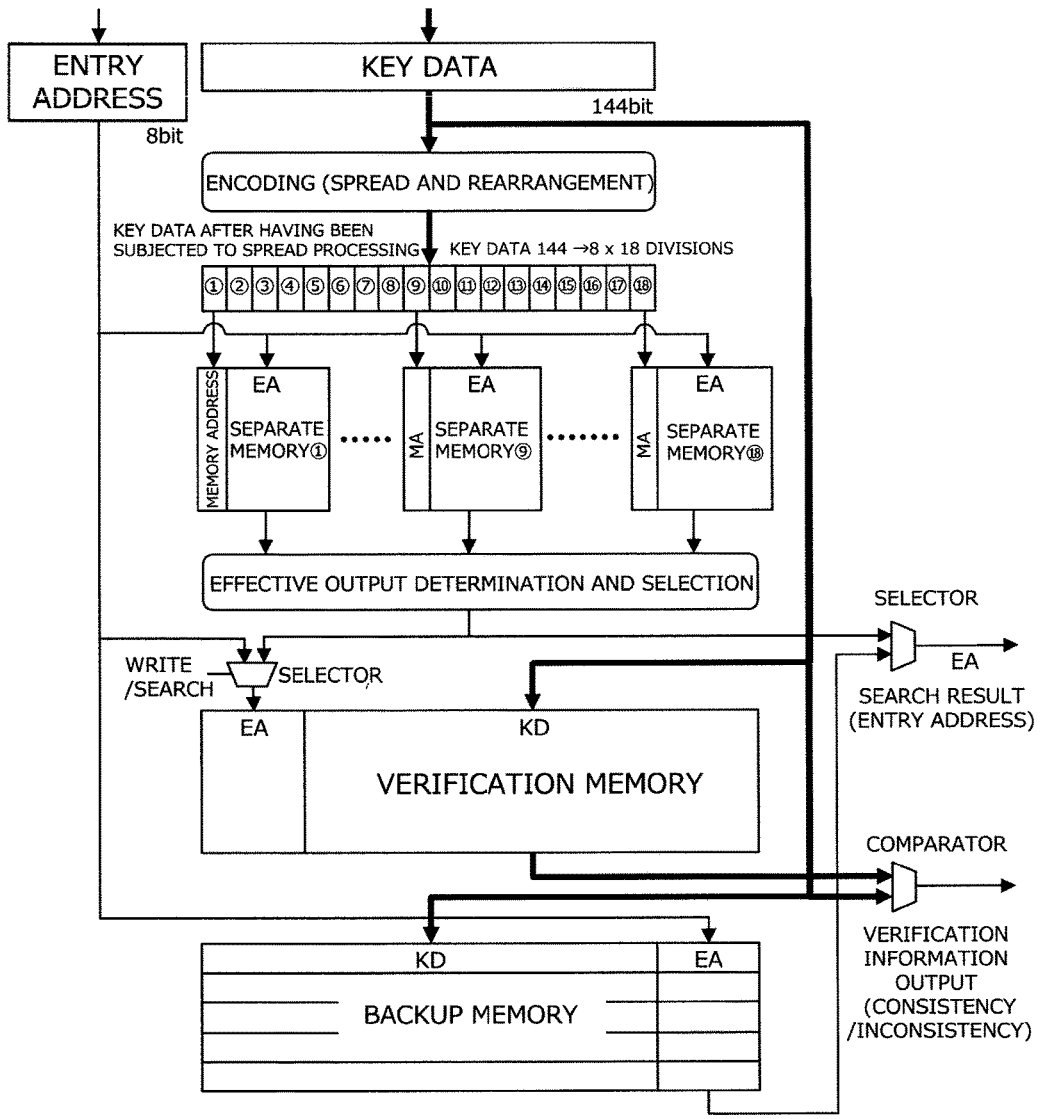
FIG. 2 illustrates a flow chart of data in the semiconductor device according to the present invention.

FIG. 1 is a functional block diagram illustrating a main functional configuration of a semiconductor device 10. In addition, FIG. 2 is a flowchart illustrating a flow of a process performed by the semiconductor device 10. Further, FIGS. 3 to 7 illustrate an example of write processing of an entry address performed by the semiconductor device 10, and FIGS. 8 to 11 illustrate an example of read processing (search processing) of the entry address performed by the semiconductor device 10.

As illustrated in FIG. 1, the semiconductor device 10 basically includes a search memory mat 100, a control circuit 200, and a verification memory 300. In addition, the semiconductor device 10 preferably includes a backup memory 400 and an encoding circuit 500. The control circuit 200 is connected to the search memory mat 100, the verification memory 300, and the backup memory 400, and serves a function of comprehensively controlling information processing to write and read predetermined data (information) to and from the respective memories 100, 300, and 400. In particular, the main functions of the control circuit 200 is write processing and read processing of data with respect to the search memory mat 100. In addition, the encoding circuit 500 may be incorporated in the control circuit 200. In this case, the control circuit 200 performs the write processing and read processing of data with respect to the respective memories 100, 300, and 400 based on data passing through the encoding circuit 500.

The search memory mat 100 is a storage device (memory) in which an entry address (EA) corresponding to key data (KD) is written in a memory space (D) specified by a memory address (MA). The search memory mat 100 has a configuration in which the memory space (D) for writing the entry address (EA) is divided into a plurality of separate memories 110a, 110b, and so on. For example, examples of the search memory mat 100 and the plurality of separate memories 110a, 110b, and so on, are illustrated in FIGS. 5 to 7, 10, 11, and the like.

Figure 5:
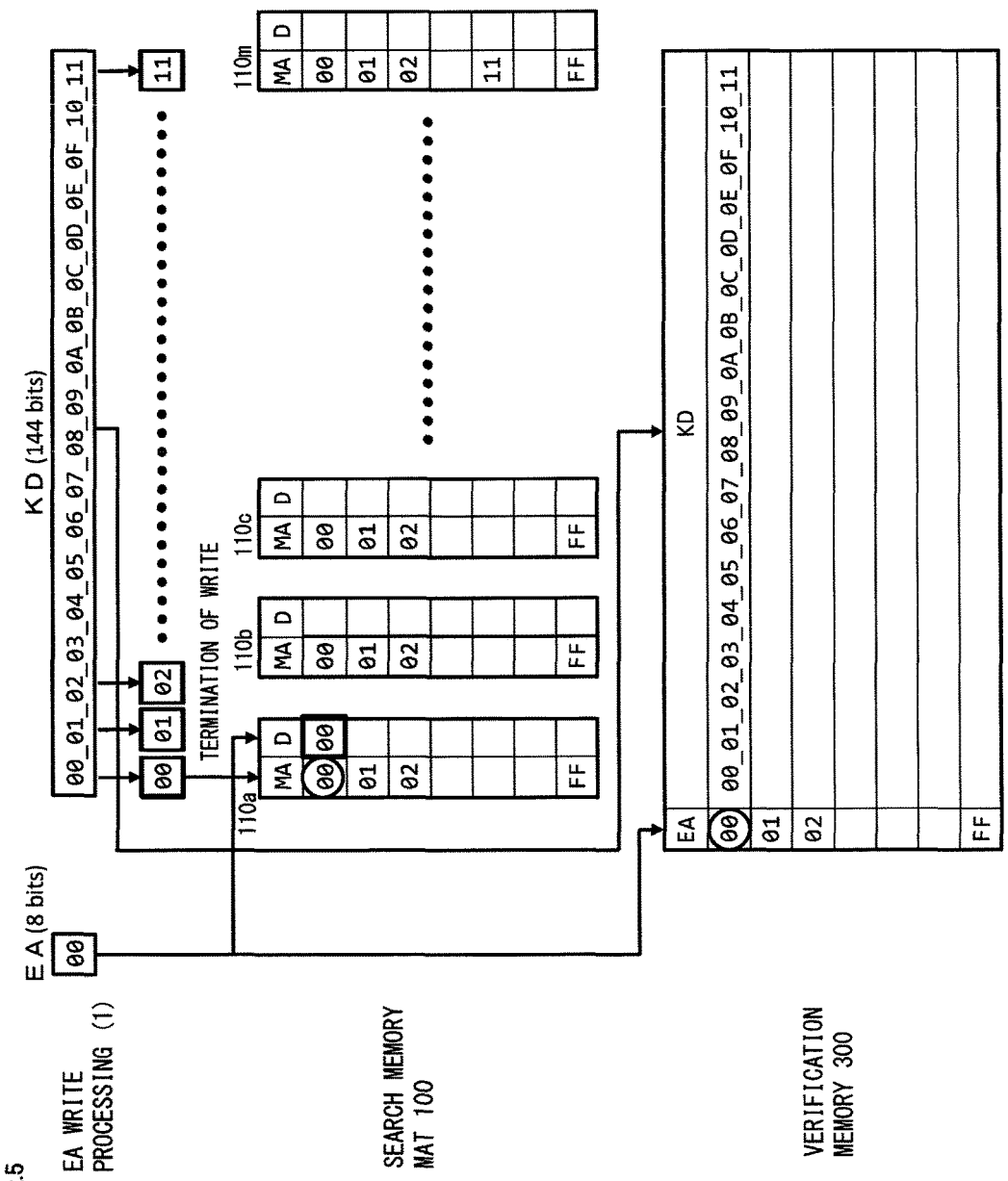
FIG. 5 illustrates an example of basic write processing.

First, a relationship between the search memory mat 100 and the entry address (EA) and the key data (KD), which are stored therein, will be briefly described with reference to FIG. 5. As illustrated in FIG. 5, the plurality of memory addresses (MA) are sequentially allocated along a y-axis direction in the search memory mat 100, and an address (location number) of the memory space (D) is specified by this memory address (MA). The memory space (D) has an area to store data along an x-axis direction. The search memory mat 100 is divided into the plurality of separate memories 110a, 110b, and so on. The plurality of separate memories 110a, 110b, and so on, hold the memory addresses (MA) and the memory spaces (D) specified by the memory addresses (MA). In addition, the respective memory addresses (MA) of the plurality of separate memories 110a, 110b, and so on, are common. That is, the respective separate memories 110a, 110b, and so on, are configured such that the memory address (MA) and the memory space (D) specified by the memory address (MA) are associated one by one. In this manner, it is possible to consider that the search memory mat 100 is divided into the plurality of separate memories 110a, 110b, and so on. In other words, the search memory mat 100 is constructed by a set of the plurality of separate memories 110a, 110b, and so on.

The semiconductor device 10 according to the present invention can be used as a content addressable memory (CAM). That is, the semiconductor device 10 writes an entry address (EA) corresponding to key data (KD) in the search memory mat 100. After then or at the same time, the semiconductor device 10 writes the key data (KD) in the verification memory 300 in association with the entry address (EA). On the other hand, when key data (KD) as a search target is input to the semiconductor device 10, the semiconductor device 10 reads and outputs this entry address (EA) corresponding to this key data (KD). That is, the "key data" means desired data to be stored in the semiconductor device 10. In addition, the "entry address" means metadata indicating a location (address) of a memory (more specifically, the verification memory 30) in which the key data (KD) is stored.

In the example illustrated in FIG. 5, the entry address (EA) is defined as 8-bit data expressed by two digits of hexadecimal notation. The entry address (EA) of 8 bits takes values of 00 to FF. The semiconductor device 10 stores one piece of key data (KD) in association with one entry address (EA). That is, one entry address (EA) is allocated to one piece of key data (KD). Thus, it is possible to store 256 pieces of key data (KD) in the semiconductor device 10 when the entry address (EA) is 8-bit information. Therefore, the total number of entries is 256 entries in the semiconductor device 10 in which the entry address is set to 8 bits. Incidentally, there is no problem as long as the entry address (EA) is data of 2 bits or more in the present invention. For example, the entry address (EA) can be set to 3 bits, 4 bits, 6 bits, or 8 bits or more. In addition, it is preferable that the bit number of the entry address (EA) coincide with the bit number of the memory address (MA) of the search memory mat 100. In the example illustrated in FIG. 5, both the entry address (EA) and the memory address (MA) are set to 8 bits.

In addition, the key data (KD) input to the semiconductor device 10 is set to 144-bit data in the example illustrated in FIG. 5. When the 144-bit key data (KD) is divided for each 8 bits so as to correspond to the bit number of the entry address (EA), the key data can be divided into eighteen pieces of data (divided data) (144 bits÷8 bits=18). Here, the number of separate memories 110a, 110b, and so on, constituting the search memory mat 100 needs to be at least the number of divisions (18) of key data or more in the semiconductor device 10 according to the present invention. Incidentally, the bit number of the key data (KD) is not limited to 144 bits, and can be appropriately adjusted as necessary. In addition, when dividing the key data (KD) into the plurality of pieces of divided data, it is preferable that the number of divisions of the bit number of the key data (KD) be the bit number of the entry address (EA). That is, it is preferable that (the number of separate memories)≥(the bit number of KD)÷(the bit number of EA).

In addition, each of the memory addresses (MA) of the separate memories 110a, 110b, and so on, is data (information) defined by 8 bits in the example illustrated in FIG. 5. That is, the divided data divided from the key data (KD) and the memory address (MA) are commonly set to 8 bits in the example illustrated in FIG. 5. In this manner, it is preferable that the bit number of the divided data and the bit number of the memory address (MA) coincide with each other. As described above, the bit number of the memory address (MA) also coincides with the bit number of the entry address (EA).

In this manner, the search memory mat 100 is configured such that the memory space (D) for writing the entry address (EA) is divided into the plurality of separate memories 110a, 110b, and so on, in the semiconductor device 10 according to the present invention. Each separate memory can be configured using a storage device, for example, a static random access memory (SRAM) or the like. That is, the search memory mat 100 can be constructed by a plurality of SRAMs functioning as the separate memories 110a, 110b, and so on. In this sense, the present invention can be said to be a CAM implemented using a plurality of SRAMs. The CAM implemented using the plurality of SRAMs as in the present invention can also be referred to as an SRAM-CAM.

In addition, when the number of key data (KD) storable in the semiconductor device 10 (the total number of entries) is set to 256 entries as in the example illustrated in FIG. 5, a bit size of the entry address (EA) necessary for identification of these 256 entries is 8 bits. In addition, when a bit size of the key data input to the semiconductor device 10 is set to 144 bits, a result of dividing this bit size by the bit number of the entry address (EA), that is, 8 is 18. Assuming such conditions, the number of the separate memories 110a, 110b, and so on, needs to be at least eighteen or more.

In the semiconductor device 10 according to the present invention, the number N of the separate memories 110a, 110b, and so on, required at the minimum (the division number N of the search memory mat 100) can be obtained by the following Formula.

$$N = L/\log_2 \cdot M \quad \text{(Formula)}$$

L: Key data length (bit number)
M: Total entry number
N: Minimum number of separate memories (division number of search memory mat)

Subsequently, the write processing and read processing performed by the semiconductor device 10 will be described with reference to FIGS. 1 to 7. Incidentally, the encoding processing performed by the encoding circuit 500 illustrated in FIGS. 1 and 2 will be described later in detail. First, basic write processing performed by the semiconductor device 10 will be described except for the encoding processing.

As illustrated in FIG. 1, the control circuit 200 according to the present embodiment includes an input unit 210, a dividing unit 220, a writing unit 230, a reading unit 240, a verifying unit 250, an output unit 260, and a narrowing unit 270. These elements 210 to 270 are illustrated by conceptually classifying functions of the control circuit 200. That is, the control circuit 200 performs processes of writing the entry address (EA) in the search memory mat 100 and reading the entry address (EA) stored in the search memory mat 100 using these functional elements 210 to 270. In addition, FIG. 2 illustrates a flow of information processing performed by each element of the control circuit 200.

Figure 3:
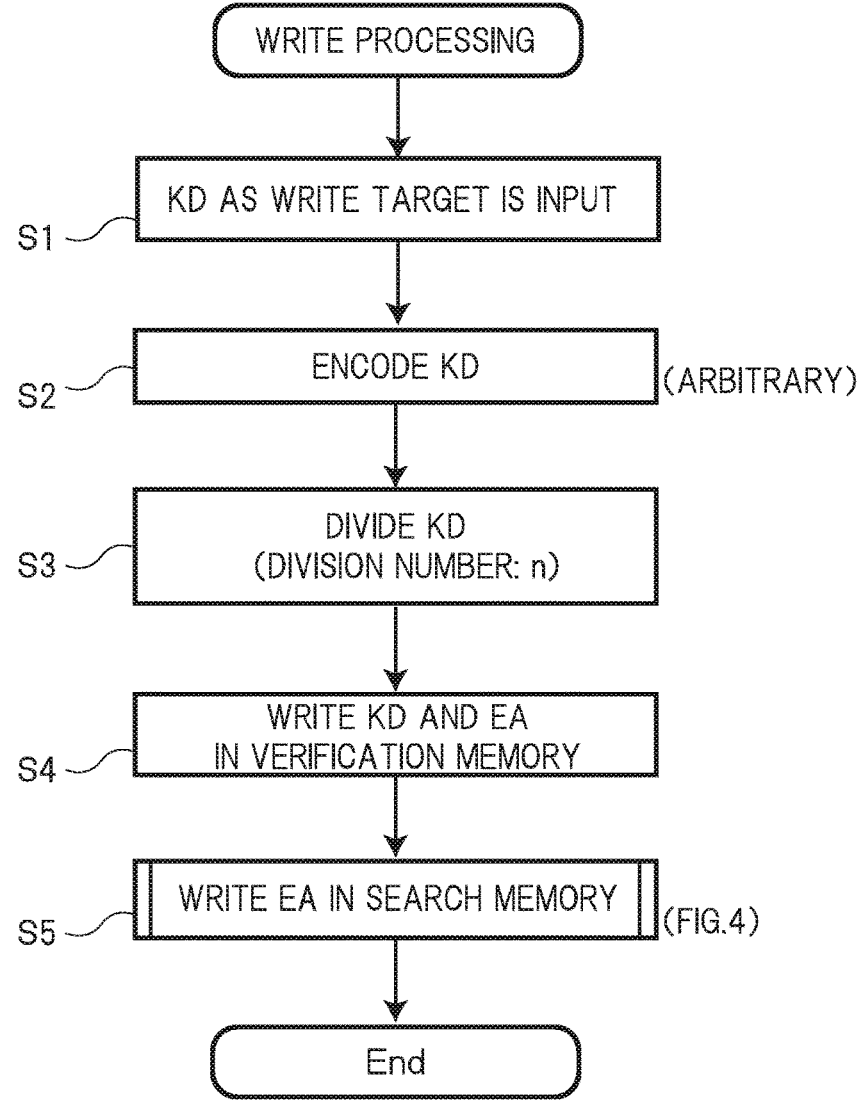
FIG. 3 illustrates a main flow of an information writing method according to the present invention.
Figure 4:
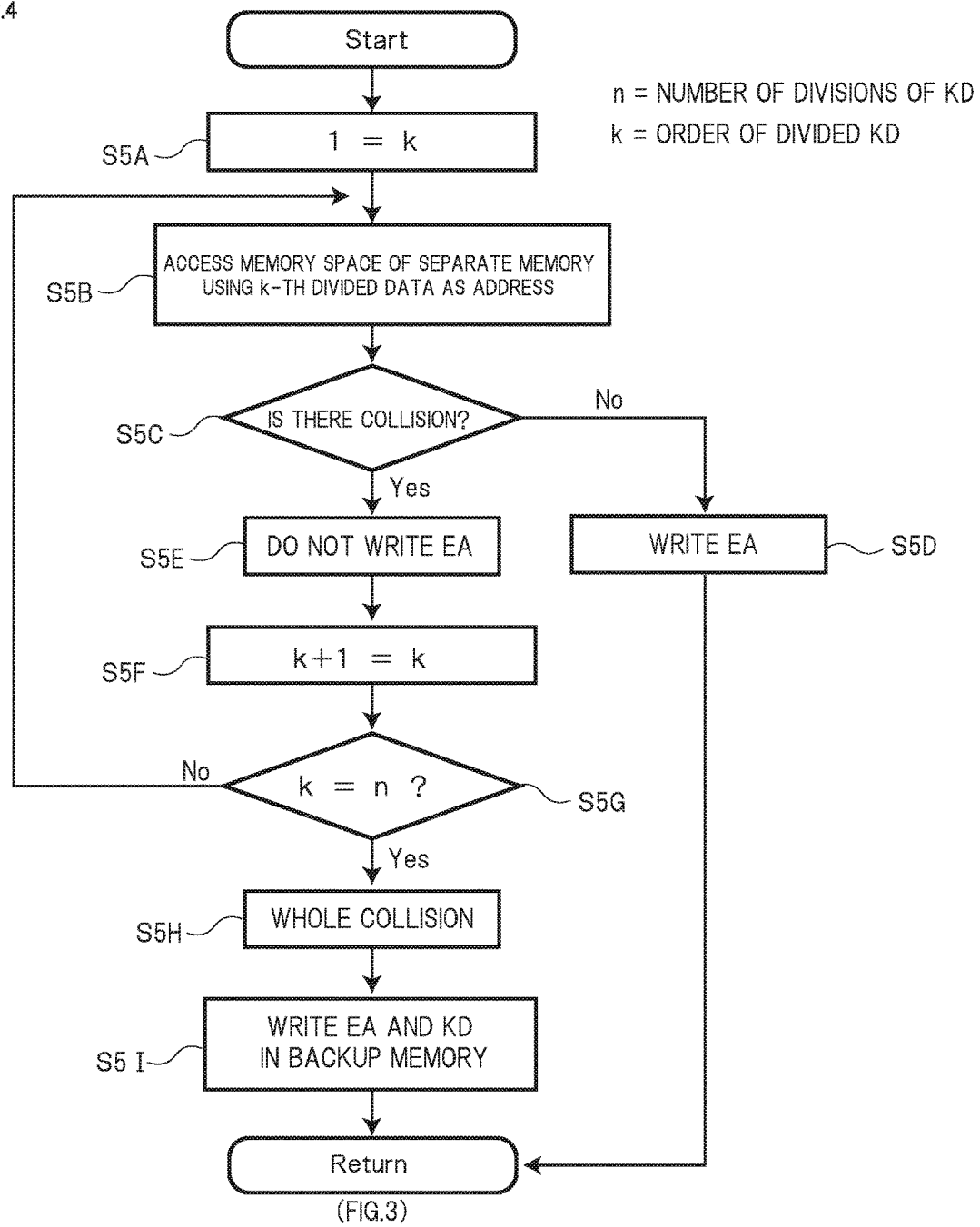
FIG. 4 illustrates a sub-flow of the information writing method according to the present invention.
Figure 6:
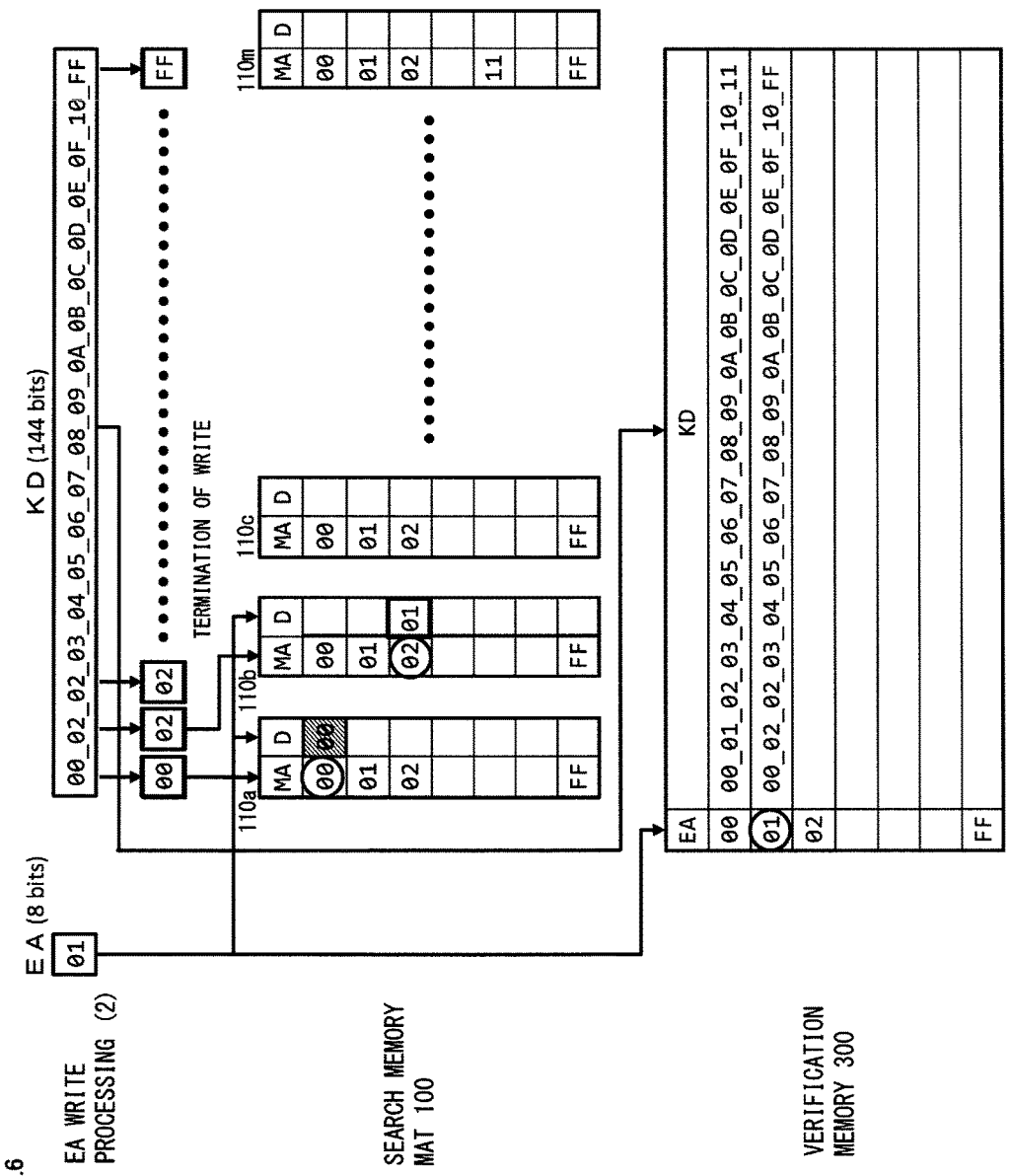
FIG. 6 illustrates an example of write processing when a collision occurs.
Figure 7:
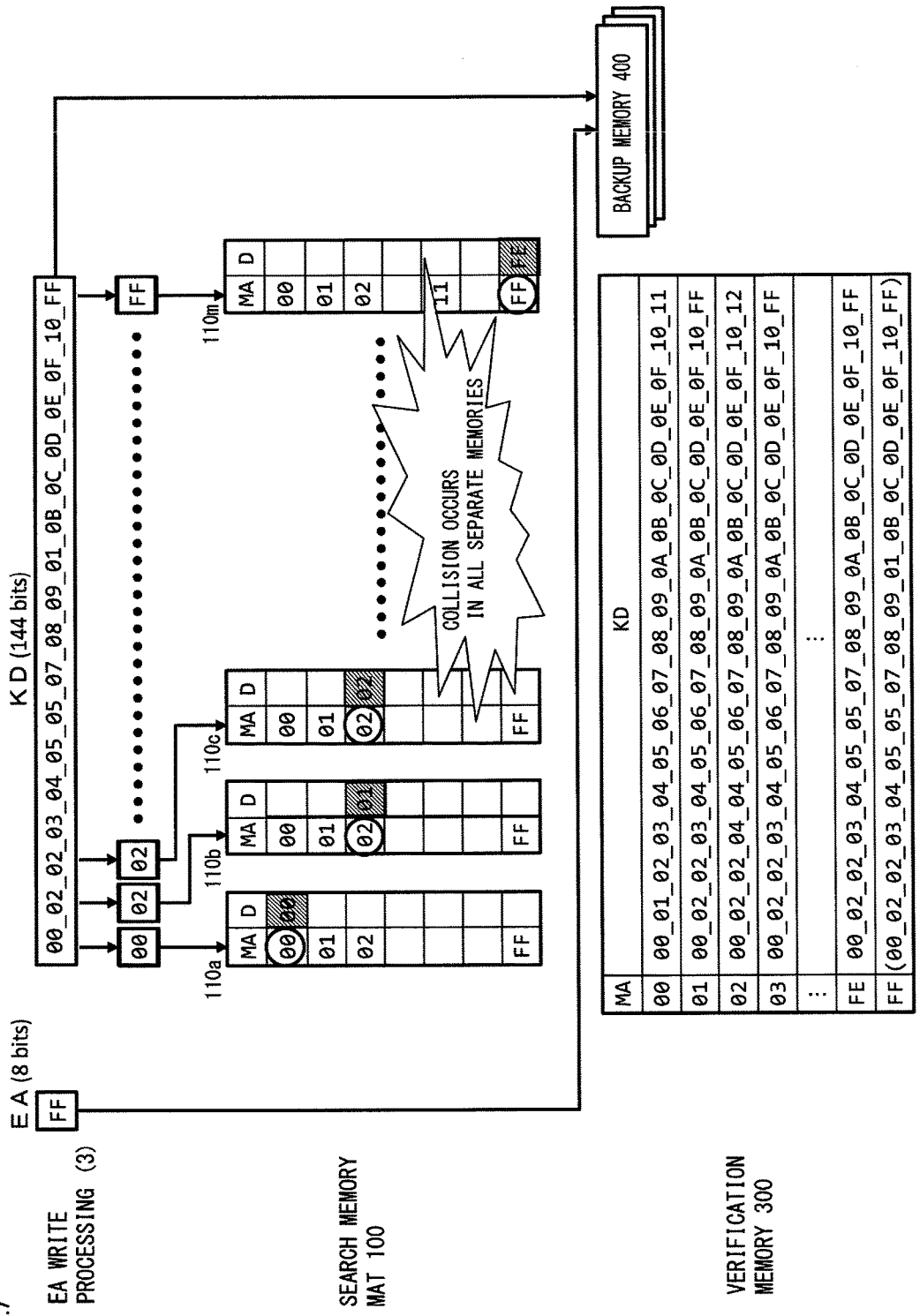
FIG. 7 illustrates an example of the write processing when the whole collision occurs.

First, the write processing of the entry address (EA) performed by the control circuit 200 will be described. The main flow of the basic write processing is illustrated in FIG. 3. In addition, FIG. 4 illustrates a specific flow of the process (step S5) of writing the entry address (EA) in the search memory mat 100 of the main flow illustrated in FIG. 3. Further, specific examples of the write processing are illustrated in FIGS. 5 to 7. Here, the write processing is a process of storing new key data (KD) in the semiconductor device 10. In this semiconductor device 10, a process of writing an entry address (EA) corresponding to key data (KD) as a new write target in the search memory mat 100 is performed.

As illustrated in FIG. 3, first, key data as a write target is input to the semiconductor device 10 in the write processing (step S1). Here, the key data as the write target is input to the input unit 210 of the control circuit 200 as illustrated in FIG. 2. When the key data as the write target is input to the input unit 210 of the control circuit 200, the input unit 210 sends the key data to the dividing unit 220 and the writing unit 230. In addition, the input unit 210 may send the input key data to the dividing unit 220 via the encoding circuit 500. Incidentally, details of the processing performed by the encoding circuit 500 (step S2) will be described later. In this manner, the input unit 210 functions as an input interface in the control circuit 200.

Subsequently, the dividing unit 220 divides the key data as the write target into a plurality of pieces of divided data (step S3). For example, the dividing unit 220 preferably divides the key data into the number of pieces of data equal to the number of the separate memories 110a, 110b, and so on, constructing the search memory mat 100. That is, the division number n to divide the key data is preferably equal to the number N of the separate memories 110a, 110b, and so on, constructing the search memory mat 100. As a result, it is possible to sequentially allocate the entire key data (divided data) divided into the plurality of pieces by the dividing unit 220 to the plurality of separate memories 110a, 110b, and so on. For example, it is assumed that 144-bit key data is input to the semiconductor device 10 in the example illustrated in FIG. 5. In addition, a bit number of an entry address allocated to each key data is 8 bits, and the number of separate memories is eighteen. Under such conditions, the dividing unit 220 preferably divides the 144-bit key data into eighteen pieces of divided data every 8 bits. The 144-bit key data is converted into the eighteen pieces of divided data in a unit of 8 bits by the dividing unit 220. Incidentally, the condition of division performed by the dividing unit 220 can be appropriately changed according to the number of separate memories, the bit number of the entry address, the bit number of the key data, and the like. The plurality of pieces of divided data generated by the dividing unit 220 is sent to the writing unit 230.

To be more specific, the bit number (α) of the divided data divided by the dividing unit 220 is preferably equal to the bit number (β) of the memory address (MA) of the search memory mat 100 (α=β). When the memory address (MA) of the search memory mat 100 is represented by 8 bits, for example, as illustrated in FIG. 5 and the like, the dividing unit 220 preferably divides the key data (KD) into 8-bit divided data. In addition, when the memory address (MA) of the search memory mat 100 is represented by 2 bits, for example, the dividing unit 220 preferably divides the key data (KD) into 2-bit divided data. Accordingly, it is possible to appropriately allocate the divided data divided by the dividing unit 220 to the separate memories constructing the search memory mat 100, respectively, using the divided data as addresses in the subsequent processing.

As illustrated in FIG. 1, the writing unit 230 has a function of writing predetermined data in the plurality of separate memories 110a, 110b, and so on, constituting the search memory mat 100, the verification memory 300, and the backup memory 400.

When key data (KD) as a write target is input to the semiconductor device 10, the writing unit 230 first allocates a unique entry address (EA) to this key data (KD) as illustrated in FIGS. 1 and 2. The single entry address (EA) is allocated to one piece of key data (KD).

In addition, the writing unit 230 receives the key data (KD) as the write target input to the input unit 210 (key data in an undivided state) as illustrated in FIG. 1. Then, the writing unit 230 allocates one entry address (EA) to the key data (KD), and writes these key data (KD) and entry address (EA) in the verification memory 300 in association with each other (step S4). That is, when key data as a new write target is input to the semiconductor device 10, the writing unit 230 allocates one entry address to this new key data, and stores the correspondence between the new key data and the entry address in the verification memory 300. As a result, the entry addresses (EA) and the key data (KD) are stored with one-to-one correspondence in the verification memory 300. In this manner, the verification memory 300 also functions as a database configured to store the correspondence between the key data and the entry address. In addition, the verification memory 300 is also used when performing verification on whether or not an entry address read by the control circuit 200 is correct at the time of performing the read processing as will be described later. The verification memory 300 can be configured using a known storage device such as an SRAM.

Incidentally, the verification memory 300 may have a configuration in which all entry addresses (EA) are registered in advance. That is, the verification memory 300 is configured such that a free memory space is specified by an entry address (EA) registered in advance, and key data (KD) can be written in this free memory space. For example, the writing unit 230 accesses the verification memory 300 by referring to an entry address (EA) allocated to the key data (KD). Then, the key data (KD) is written in a memory space specified by the entry address (EA) in the verification memory 300. Even with such processing, one entry address (EA) and one piece of key data (KD) are eventually stored in the verification memory 300 in association with each other.

Subsequently, the writing unit 230 performs a process of writing the entry addresses (EA) corresponding to the key data (KD) in the plurality of separate memories 110a, 110b, and so on, constituting the search memory mat 100 after allocating or at the same time of allocating the unique entry address (EA) to the key data (KD) (step S5). Specifically, the writing unit 230 allocates the plurality of pieces of divided data to the separate memories 110a, 110b, and so on, respectively, accesses the memory space of each of the separate memories 110a, 110b, and so on, using each divided data as an address, and sequentially writes the entry addresses corresponding to the divided data in the accessed memory spaces. The process performed in step S5 is described in more detail in FIG. 4.

The flow chart of FIG. 4 illustrates a case where the key data (KD) is divided into n pieces of divided data, and the order of the divided key data is defined to be the k-th. As illustrated in FIG. 4, first, "1" is substituted for "k", and processing for the first (initial) divided data among the n pieces of divided data is started (step S5A).

Next, the writing unit 230 allocates a unique entry address (EA) to the first (k-th) divided data, and accesses the memory space of the separate memory using this first divided data as an address (step S5B). Specifically, the writing unit 230 first sends the first (k-th) divided data to the first (k-th) separate memory 110a. In addition, the writing unit 230 searches for a memory address (MA) having the same value as the first divided data from among a plurality of memory addresses (MA) allocated to the first separate memory 110a. Then, the writing unit 230 accesses a memory space specified by the memory address (MA) having the same value as the first divided data in the memory space of the first separate memory 110a.

Subsequently, the writing unit 230 determines whether or not an entry address corresponding to another divided data has already been written in the memory space accessed based on the first (k-th) divided data and whether a collision between entry addresses occurs (step S5C). For example, when the write processing of another key data is performed before key data that is currently being written, the collision between entry addresses may occur.

When it is determined in step S5C that the collision of the entry address does not occur, the writing unit 230 writes the entry address corresponding to the first (k-th) divided data in the memory space of the first separate memory 110a accessed based on this divided data (step S5D). As a result, the write processing of the entry address corresponding to the first (k-th) divided data is completed.

Here, when the entry address (EA) has been successfully written for one piece of divided data among the plurality of pieces of divided data obtained from certain key data (KD), the write processing of the entry address (EA) is stopped for the subsequent divided data in the present invention, as illustrated in FIG. 4. Thus, the process returns to the main flow (FIG. 3) after step S5D, and the entire write processing of the entry address is completed. In this manner, only one entry address (EA) is written in the search memory mat 100 for one piece of key data (KD) in the present invention. As a result, it is possible to increase the write capacity (search capacity), and at the same time, to increase the speed of the write processing. In addition, it is possible to implement the reduction in size of the entire semiconductor device due to the increase in the write capacity.

On the other hand, when it is determined in step S5C that the entry address (EA) corresponding to another divided data has already been written in the memory space of the first separate memory 110a accessed based on the first (k-th) divided data, the writing unit 230 does not perform the write processing of the entry address corresponding to the first divided data (step S5E). Thus, only the entry address corresponding to the other divided data for which the write processing has already been completed remains in the memory space. In this manner, it is enough to record only one entry address in one memory space in the present invention. Even from this point, it is possible to achieve the efficiency of the write processing in the present invention.

When the writing of the entry address has failed as in step S5E, the writing unit 230 performs write processing of next divided data. That is, the writing unit 230 adds "1" to "k" and substitutes a value of "k+1" for "k" (step S5F) after the above-described step S5E. Then, the writing unit 230 verifies whether or not a value of "k" obtained through step S5F is equal to "n (the division number of key data)" (step S5G). When k is not equal to n (k≠n), the writing unit 230 returns to step S5B. For example, the processing for the second ((k+1)-th) divided data is continuously performed after the processing for the first (k-th) divided data is completed. In this manner, the writing unit 230 sequentially processes the plurality of pieces of divided data until the writing of the entry address is succeeded. Although "1" is added to "k" in step S5F in the example illustrated in FIG. 4 in order to simplify the description, it is also possible to adopt other algorithms that can process the plurality of pieces of divided data one by one, for example, by adding "−1" to "k".

Subsequently, when it is determined in step S5G that "k=n", it is possible to say that collisions occur for all of the plurality of pieces of divided data obtained by dividing one piece of key data (KD) (step S5H). In this manner, when the whole collision occurs in the write processing of the entry address (EA), the writing unit 230 fails to write the entry address (EA) corresponding to the key data (KD) in the search memory mat 100. In such a case, the writing unit 230 performs a process of writing the key data (KD) as the write target input to the input unit 210 and the entry address (EA) corresponding thereto in the backup memory 400 in association with each other (step S5I). As illustrated in FIG. 2, for example, the backup memory 400 is a memory that can store the key data (KD) and the entry address (EA) with one-to-one correspondence. It is possible to configure the backup memory 400 using a known memory such as an SRAM. In this manner, for the key data (KD) in which the whole collision occurs, the writing unit 230 preferably writes the key data in the backup memory 400 without writing the key data in the search memory mat 100 in order to avoid the whole collision. When the backup memory 400 is provided in addition to the search memory mat 100, it is easy to perform the write processing of the key data (KD) in which the whole collision occurs, and it is possible to efficiently perform the search processing (read processing) of key data (KD) in which the whole collision occurs. Incidentally, when the whole collision is generated in the write processing and the key data is written in the backup memory 400, it is also possible to omit the above-described process (step S4) of writing the key data in the verification memory 300. That is, the key data may be written or not necessarily written in the verification memory 300 when writing the key data in the backup memory 400.

As described above, the writing unit 230 performs the process of writing the entry address (EA) corresponding to the key data (KD) as the write target in the search memory mat 100 or the backup memory 400 according to steps S5A to S5I. Thereafter, the writing unit 230 terminates the write processing and returns to the main flow illustrated in FIG. 3.

Next, the write processing performed by the writing unit 230 will be described with the specific examples with reference to FIGS. 5 to 7.

First, FIG. 5 illustrates an example of the basic write processing. In the example illustrated in FIG. 5, key data (KD) having a value "00_01_02_03_04_05_06_07_08_09_0A_0B_0C_0D_0E_0F_10_11" is input to the semiconductor device 10. Incidentally, the underline is given for convenience and does not originally exist. The key data (KD) is the value of 144 bits expressed in hexadecimal notation. The writing unit 230 first allocates an entry address (EA) having a value of "00" to this key data (KD). The entry address (EA) is a value of 8 bits expressed by two digits of hexadecimal notation. Incidentally, the entry address (EA) may be allocated in the ascending order of numerical values. However, the entry address (EA) may be randomly allocated, for example, or free ones may be allocated in order as needed.

In addition, the writing unit 230 associates key data (KD) as a write target with a unique entry address (EA), and writes these values in the verification memory 300 as illustrated in FIG. 4. As a result, the entry address (EA) and the key data (KD) are stored in the verification memory 300 with one-to-one correspondence.

In addition, when key data (KD) is input to the semiconductor device 10, the dividing unit 220 divides the key data (KD) into a plurality of pieces of divided data. In the example illustrated in FIG. 5, the memory address (MA) and the entry address (EA) of the search memory mat 100 are values of 8 bits. In addition, the search memory mat 100 is divided into the eighteen separate memories 110a, 110b, . . . , and 110m. Then, the dividing unit 220 divides the 144-bit key data (KD) into eighteen pieces of divided data in a unit of 8 bits. Thus, each divided data has a value of 8 bits. In the example illustrated in FIG. 5, the key data (KD) is divided into the eighteen pieces of divided data, that is, "00", "01", "02", "03", "04", "05", "06", "07", "08", "09", "0A", "0B", "0C", "0D", "0E", "0F", "10", and "11".

Thereafter, the writing unit 230 allocates the divided data generated by the dividing unit 220 to the separate memories 110a to 110m, and writes the entry addresses (EA). As illustrated in FIG. 5, the writing unit 230 first allocates the first divided data "00" to the first separate memory 110a. The first separate memory 110a has an 8-bit memory address (MA) having values of "00" to "FF". Here, the writing unit 230 designates a memory address (MA) "00" of the first separate memory 110a by referring to the first divided data "00", and accesses a memory space (D) specified by this memory address "00". Then, the writing unit 230 writes an entry address (EA) "00" corresponding to the first divided data "00" in the memory space (D) specified by the memory address "00". In the example illustrated in FIG. 5, the write processing of the entry address (EA) "00" has succeeded for the first divided data "00". Thus, the write processing of the entry address (EA) is not performed for the second and subsequent divided data "01", "02", and so on. Therefore, it is enough to perform the write processing of the entry address (EA) only for the first divided data "00" with respect to the key data (KD) of FIG. 5.

Subsequently, an example in the case where the "collision" of the entry address (EA) occurs in the write processing will be described with reference to FIG. 6. In the semiconductor device according to the present invention, the writing unit 230 writes entry addresses (EA) corresponding to divided data to the separate memories 110a and so on, using the divided data as an address. Thus, there is a possibility that a plurality of entry addresses (EA) is written in the same memory space of the same separate memory. In this specification, a phenomenon where the plurality of entry addresses is written in the same memory space in this manner is expressed as the "collision". Here, the semiconductor device according to the present invention does not write an entry address (EA) in the memory space where the "collision" occurs in a superimposed manner when the "collision" occurs at the time of performing the write processing of the entry address (EA). When the collision occurs in the write processing, the writing unit 230 does not write the entry address for the divided data in which the collision has occurred, but starts the write processing of the entry address for the next divided data.

In the example illustrated in FIG. 6, key data (KD) having a value of "00_02_02_03_04_05_06_07_08_09_0A_0B_0C_0D_0E_0F_10_FF" is input to the semiconductor device 10 subsequently to the key data (KD) illustrated in FIG. 5. The writing unit 230 first allocates an entry address (EA) having a value of "01" to this key data (KD). Then, the writing unit 230 registers the key data (KD) and the entry address (EA) in the verification memory 300 in association with each other.

In addition, when key data (KD) is input to the semiconductor device 10, the dividing unit 220 divides the key data (KD) into a plurality of pieces of divided data. The dividing unit 220 divides the 144-bit key data (KD) into eighteen pieces of divided data in a unit of 8 bits. In the example illustrated in FIG. 6, the key data (KD) is divided into the eighteen pieces of divided data, that is, "00", "02", "02", "03", "04", "05", "06", "07", "08", "09", "0A", "0B", "0C", "0D", "0E", "0F", "10", and "FF".

Thereafter, the writing unit 230 allocates the plurality of pieces of divided data generated by the dividing unit 220 to the separate memories 110a to 110m, respectively, and writes the entry addresses (EA). As illustrated in FIG. 6, the writing unit 230 first allocates the first divided data "00" to the first separate memory 110a, designates a memory address (MA) "00" of the first separate memory 110a by referring to the first divided data "00", and accesses a memory space (D) specified by this memory address "00". Then, the writing unit 230 attempts to write an entry address (EA) "01" corresponding to the first divided data "00" in this memory space (D). However, another entry address (EA) "00" has already been written in the memory space (D) specified by this memory address "00" (see FIG. 5). Thus, the writing unit 230 fails to write the new entry address (EA) "01" in this memory space (D). In this manner, the phenomenon where a plurality of entry addresses (EA) is written in one memory space is referred to as the "collision". When the "collision" occurs, the writing unit 230 ends the process without writing the entry address (EA) "01" for the first divided data "00".

Next, the writing unit 230 starts a process of writing the entry address (EA) "01" for the second divided data "02". That is, the writing unit 230 allocates the second divided data "02" to the second separate memory 110b, designates a memory address (MA) "02" of the second separate memory 110b by referring to the second divided data "02", and writes the entry address (EA) "01" corresponding to the second divided data "02" in a memory space (D) specified by this memory address "02". Since no collision occurs for the second divided data "02", it is possible to write the entry address (EA) "01" in the second separate memory 110b. Therefore, the writing unit 230 writes the entry address (EA) "01" corresponding to the second divided data "02" in the memory space (D) specified by the memory address "02". In this manner, the write processing of the entry address (EA) "01" has succeeded for the second divided data "02" in the example illustrated in FIG. 6. Thus, the write processing of the entry address (EA) is not performed for the third and subsequent divided data "02", "03", and so on. Therefore, it is enough to perform the write processing of the entry address (EA) only for the second divided data "02" with respect to the key data (KD) of FIG. 6.

In this manner, the writing unit 230 does not perform the write processing of the entry address for the divided data in which the collision occurs. In addition, the writing unit 230 keeps performing the write processing on the plurality of pieces of divided data until the writing of the entry address has succeeded. Further, when the writing of the entry address has succeeded, the write processing is terminated, and the write processing is not performed for the subsequent divided data. As a result, it is possible to increase the write capacity of the search memory mat and achieve the increase in speed of the write processing.

Subsequently, an example in the case where the "whole collision" of the entry address (EA) occurs in the write processing will be described with reference to FIG. 7. As described above, the semiconductor device 10 according to the present invention sequentially registers entry addresses (EA) in memory spaces of the search memory mat 100. However, there is a possibility that collisions occur for all of the plurality of pieces of divided data generated from one piece of key data (KD). Although the possibility that the whole collision occurs is extremely low, the whole collision can be generated theoretically. Thus, FIG. 7 illustrates countermeasures for the case where the whole collision occurs.

FIG. 7 illustrates an example of the write processing in the case where the whole collision occurs. In the example illustrated in FIG. 7, key data (KD) having a value of "00_02_02_03_04_05_05_07_08_09_01_0B_0C_0D_0E_0F_10_FF" is input to the semiconductor device 10 at a stage of completing the write processing of a plurality of pieces of key data (KD) to some extent. The writing unit 230 first allocates an entry address (EA) having a value of "FF" to this key data (KD).

Subsequently, when key data (KD) is input to the semiconductor device 10, the dividing unit 220 divides the key data (KD) into a plurality of pieces of divided data. The dividing unit 220 divides the 144-bit key data (KD) into eighteen pieces of divided data in a unit of 8 bits. In the example illustrated in FIG. 7, the key data (KD) is divided into the eighteen pieces of divided data, that is, "00", "02", "02", "03", "04", "05", "05", "07", "08", "09", "01", "0B", "0C", "0D", "0E", "0F", "10", and "FF".

Thereafter, the writing unit 230 allocates the divided data generated by the dividing unit 220 to the separate memories 110a to 110m, and writes the entry addresses (EA). However, another entry address (EA) has already been written in the memory space (D) corresponding to the divided data for all the first to eighteenth separate memories 110a to 110m. Thus, it is difficult for the writing unit 230 to write the entry address (EA) corresponding to the divided data into the search memory mat 100.

Therefore, when the whole collision occurs, the writing unit 230 writes the key data (KD) where the whole collision has occurred in the backup memory 400 in association with a unique entry address (EA). As illustrated in FIG. 2, for example, the backup memory 400 is a memory that can store the key data (KD) and the entry address (EA) with one-to-one correspondence. It is possible to configure the backup memory 400 using a known memory such as an SRAM. In this manner, the writing unit 230 preferably writes the key data (KD), which causes the whole collision if being written in the search memory mat 100, in the backup memory 400. When the backup memory 400 is provided in addition to the search memory mat 100, it is easy to perform the write processing of the key data (KD) in which the whole collision occurs, and it is possible to efficiently perform the search processing (read processing) of key data (KD) in which the whole collision occurs. Incidentally, when the whole collision is generated as described above and the key data (KD) is written in the backup memory 400, the writing unit 230 may write or does not necessarily write the same key data (KD) in the verification memory 300. It is possible to arbitrarily design whether or not to write the key data in which the whole collision has occurred in the verification memory 300.

Subsequently, basic read processing (search processing) performed by the semiconductor device 10 will be described with reference to FIGS. 1, 2, and 8 to 11. The read processing herein means a process of searching the search memory mat 100 and reading and outputting an entry address (EA) corresponding to key data (KD) as a search target, performed by the semiconductor device 10, when the key data (KD) as the search target is input to the semiconductor device 10. Incidentally, the read processing including the encoding processing will be described later.

Figure 8:
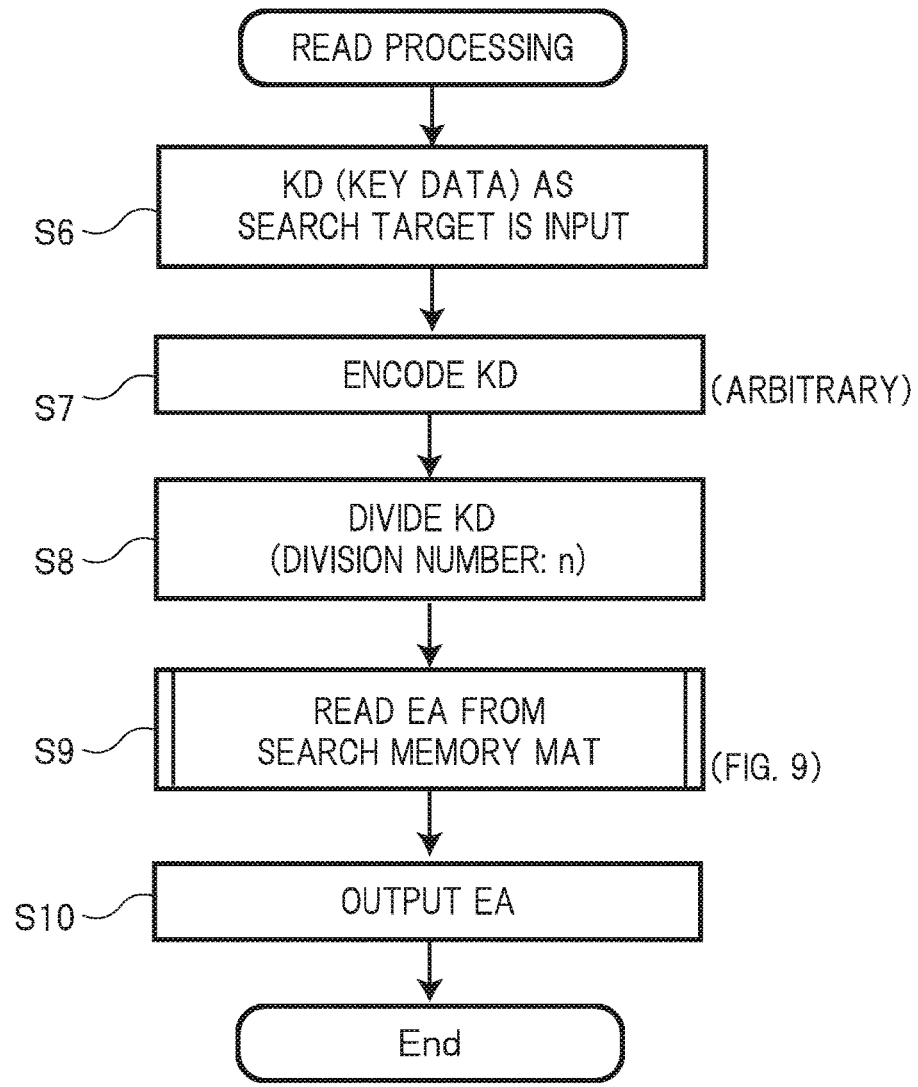
FIG. 8 illustrates a main flow of an information reading method according to the present invention.
Figure 9:
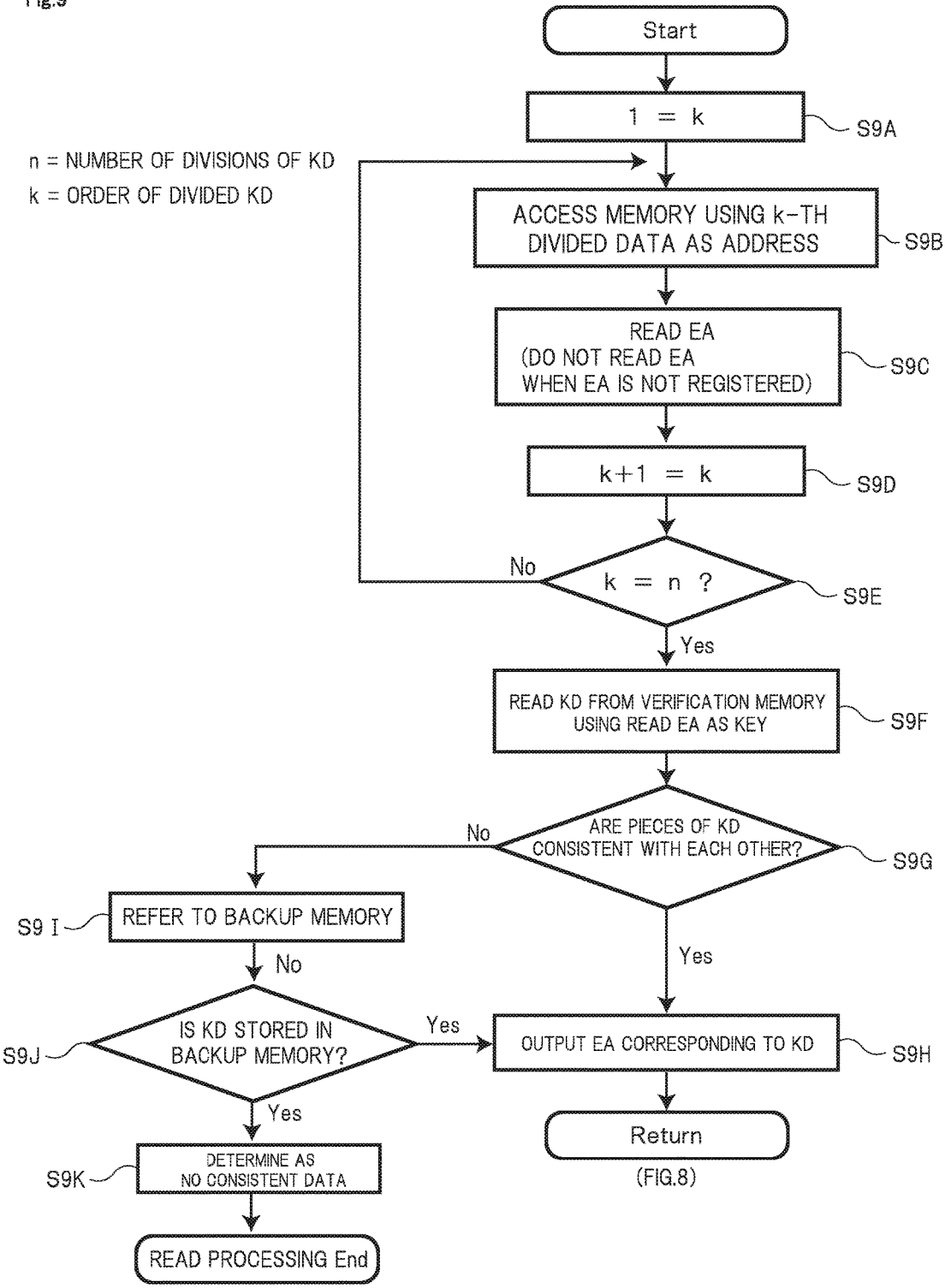
FIG. 9 illustrates a sub-flow of the information reading method according to the present invention.
Figure 10:
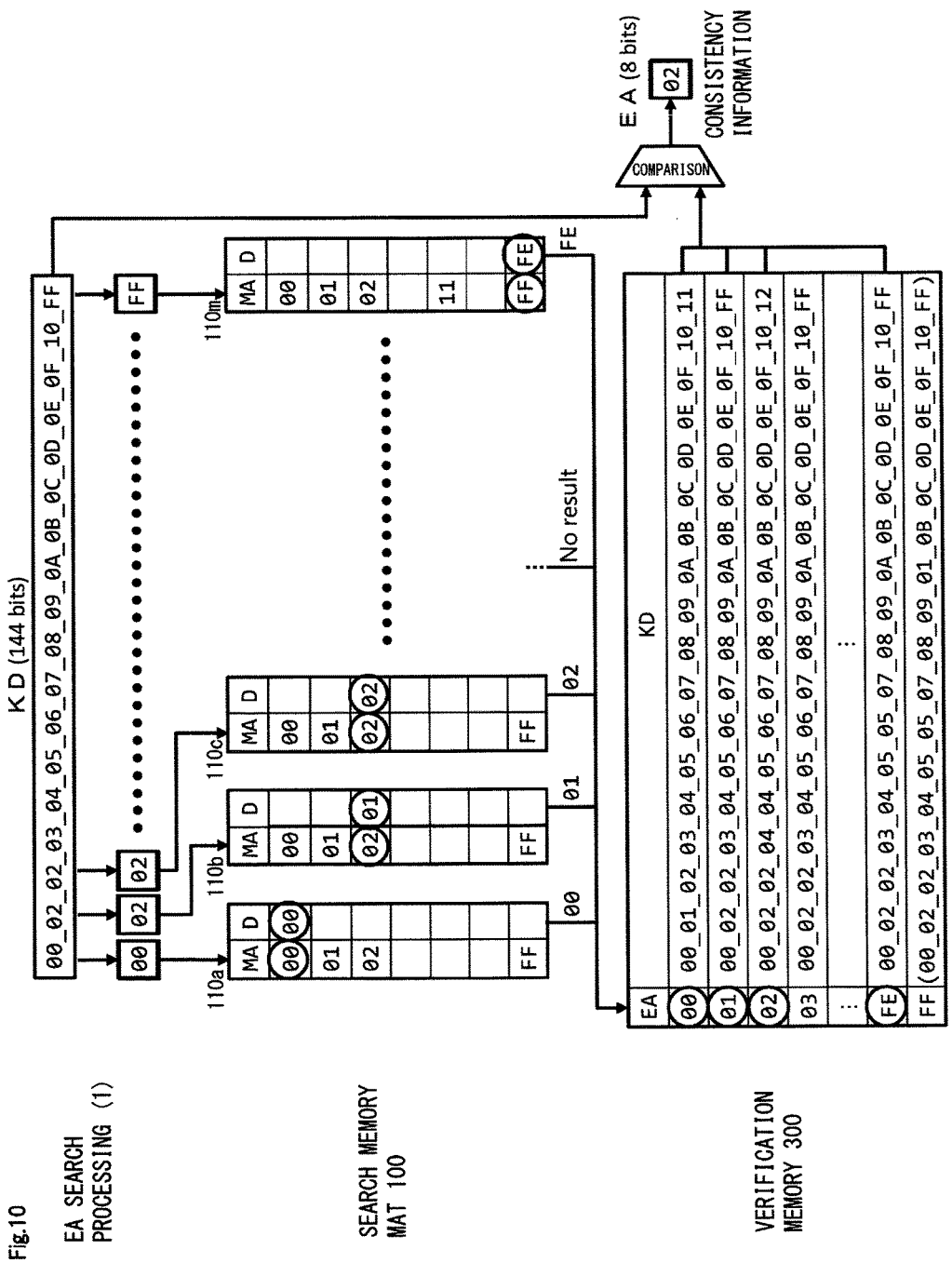
FIG. 10 illustrates an example of basic read processing.
Figure 11:
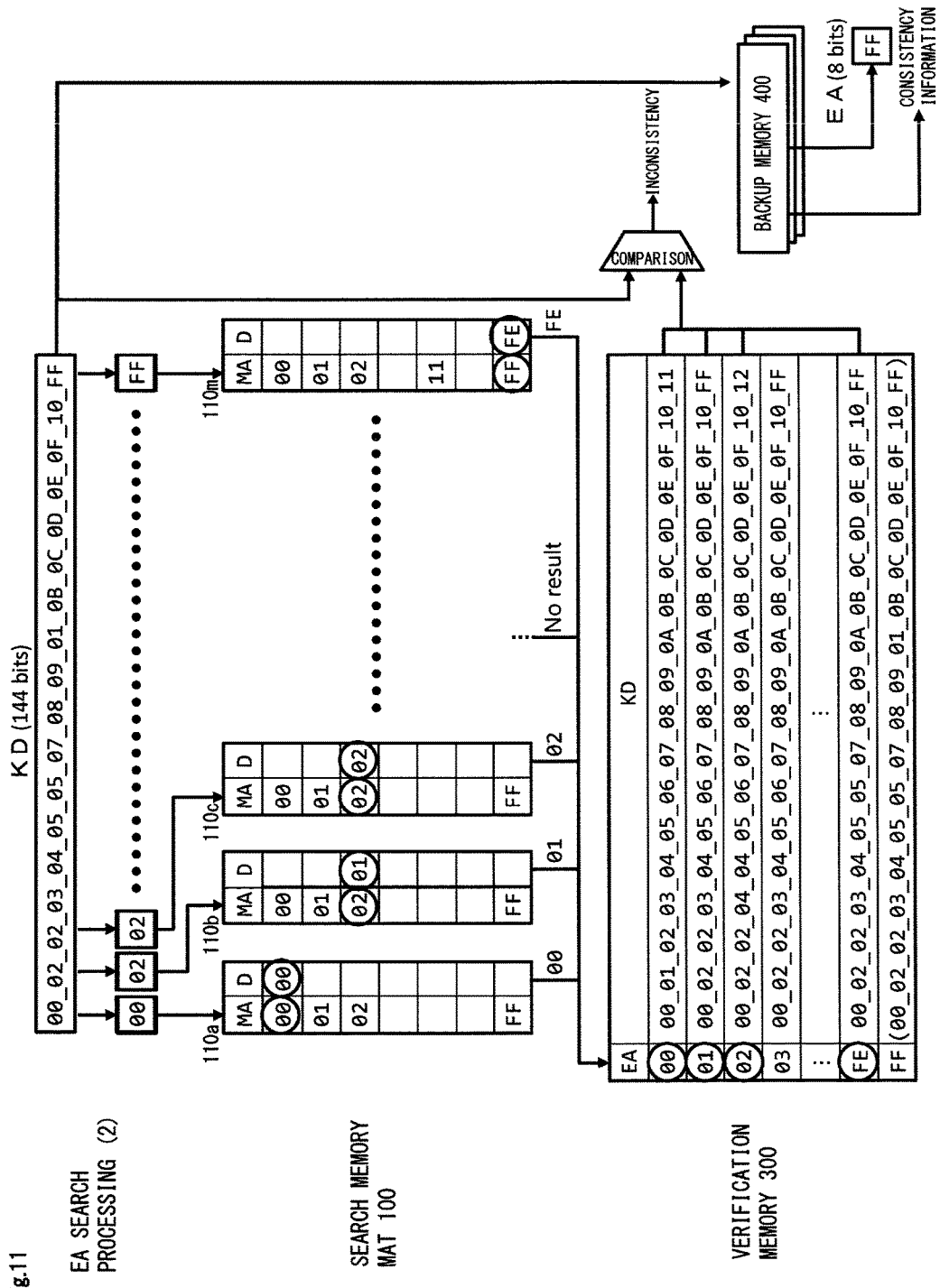
FIG. 11 illustrates an example of read processing when inconsistency occurs.

The main flow of the basic write processing is illustrated in FIG. 8. In addition, FIG. 9 illustrates a specific flow of the process (step S9) of reading the entry address (EA) from the search memory mat of the main flow illustrated in FIG. 8. Further, specific examples of the read processing are illustrated in FIGS. 10 and 11. In this semiconductor device 10, a process of reading an entry address (EA) corresponding to key data (KD) as a search target from the search memory mat 100 is performed.

As illustrated in FIG. 8, first, the key data as the search target is input to the semiconductor device 10 in the read processing (step S6). Here, the key data as the search target is input to the input unit 210 of the control circuit 200 as illustrated in FIG. 2. When the key data as the search target is input to the input unit 210 of the control circuit 200, the input unit 210 sends the key data to the dividing unit 220 and the verifying unit 250. In addition, the input unit 210 may send the input key data to the dividing unit 220 via the encoding circuit 500. Incidentally, details of the processing performed by the encoding circuit 500 (step S7) will be described later.

As illustrated in FIG. 8, the dividing unit 220 divides the key data (KD) as the search target into a plurality of pieces of divided data (step S8). Here, a condition (algorithm), used at the time of dividing the key data (KD) as the search target by the dividing unit 220, is the same as the above-described condition (algorithm) used at the time of dividing the key data (KD) as the write target. The plurality of pieces of divided data obtained by the dividing unit 220 is sent to the reading unit 240.

Subsequently, the reading unit 240 performs a process of reading the entry address (EA) corresponding to the key data (KD) as the search target from the search memory mat 100 (step S9). Specifically, the reading unit 240 allocates the plurality of pieces of divided data to the separate memories 110a, 110b, and so on, respectively, accesses the memory space of each of the separate memories 110a, 110b, and so on, using each divided data as an address, and sequentially reads the entry addresses (EA) stored in the accessed memory spaces. The process performed in step S9 is described in more detail in FIG. 9.

In FIG. 9, the division number of the key data (KD) is defined as n, and the order of the divided data is defined as k. As illustrated in FIG. 9, first, "1" is substituted for "k" (step S9A), and processing for the first (initial) divided data among the n pieces of divided data is started.

Next, the reading unit 240 accesses the memory space of the separate memory using the first divided data as an address (step S9B). The process of step S9B is the same as the process of step S5B illustrated in FIG. 4. That is, the reading unit 240 first sends the first (k-th) divided data to the first (k-th) separate memory 110a. In addition, the reading unit 240 searches for a memory address (MA) having the same value as the first divided data from among a plurality of memory addresses (MA) allocated to the first separate memory 110a. Then, the reading unit 240 accesses a memory space specified by the memory address (MA) having the same value as the first divided data in the memory space of the first separate memory 110a.

Thereafter, the reading unit 240 reads an entry address (EA) from the memory space accessed in step S9B (step S9C). Incidentally, when the entry address (EA) is not stored in the accessed memory space, the reading unit 240 does not read anything. Alternatively, the reading unit 240 may generate a signal of "no search result".

The reading unit 240 performs such read processing for all of the separate memories 110a, 110b, and so on. That is, the reading unit 240 adds "1" to "k" and substitutes a value of "k+1" for "k" (step S9D) after the above-described step S9C. Then, the reading unit 240 verifies whether or not a value of "k" obtained through step S9D is equal to "n (the division number of key data)" (step S9E). When k is not equal to n (k≠n), the reading unit 240 returns to step S9B. For example, the read processing for the second ((k+1)-th) divided data is continuously performed after the read processing for the first (k-th) divided data is completed. In this manner, the reading unit 240 performs the read processing based on the plurality of pieces of divided data until completing the read processing of all the separate memories 110a, 110b, and so on. Although "1" is added to "k" in step S9D in the example illustrated in FIG. 9 in order to simplify the description, it is also possible to adopt other algorithms In step S9F, when it is determined that the read processing has been completed for all the divided data, that is, when it is determined that k=n, the reading unit 240 transitions to the next step S9F. In step S9F, the reading unit 240 first sends one or a plurality of entry addresses (EA) read by repeatedly performing the processes of steps S9B to S9E to the verifying unit 250. When receiving one or the plurality of entry addresses (EA) from the reading unit 240, the verifying unit 250 accesses the verification memory 300 using these entry addresses as keys. Then, the verifying unit 250 reads the key data (KD) stored in association with one or the plurality of entry addresses (EA) from the verification memory 300. That is, the key data (KD) as the write target and the entry address (EA) are stored, in association with each other, in the verification memory 300 at the time of the write processing as described above, in step S4 illustrated in FIG. 3. Thus, the verifying unit 250 can read the key data (KD) corresponding to the entry address (EA) at the time of the read processing by searching the verification memory 300 using the entry address (EA) as the key.

Subsequently, the verifying unit 250 receives the key data (KD) as the search target from the input unit 210, and determines whether or not the key data (KD) read from the verification memory 300 in step S9F is consistent with the key data (KD) as the search target (step S9G). That is, it is assumed that the reading unit 240 reads candidates of a plurality of entry addresses (EA) from the search memory mat 100 in the read processing according to the present invention. When there are the plurality of candidates of the entry addresses (EA) as described above, it is difficult to uniquely determine the entry address (EA) corresponding to the key data (KD) as the search target. Thus, the verifying unit 250 is provided in order to determine one entry address (EA) corresponding to the key data (KD) as the search target from the plurality of candidates of entry address (EA). The verifying unit 250 performs a consistency determination process (step S9G). That is, the verifying unit 250 reads candidates of a plurality of pieces of key data (KD) corresponding to the plurality of candidates of entry address (EA), respectively, from the verification memory 300 for each of the plurality of candidates of entry address (EA). In addition, the verifying unit 250 collates the plurality of candidates of key data (KD) with the key data (KD) as the search target received from the input unit 210. Then, the verifying unit 250 determines whether or not there is a candidate that is consistent with the key data (KD) as the search target among the plurality of candidates of key data (KD).

In step S9G, when the verifying unit 250 determines that there is the candidate that is consistent with the key data (KD) as the search target among the plurality of candidates of key data (KD), the process transitions to step S9H. In step S9H, the verifying unit 250 outputs an entry address (EA) corresponding to the key data (KD), determined to be consistent with the key data (KD) as the search target by the verifying unit 250, to the output unit 260 (step S9H). The read processing returns to the main flow in FIG. 8. The output unit 260 is connected to an external circuit. Thus, the entry address (EA) is output to the external circuit via the output unit 260 (step S10). In this manner, the output unit 260 functions as an output interface of the semiconductor device 10. As a result, the semiconductor device 10 can output the entry address (EA) corresponding to the key data (KD) as the search target as a search result.

On the other hand, when the verifying unit 250 determines in step S9G that there is no candidate that is consistent with the key data (KD) as the search target among the plurality of candidates of key data (KD), the process proceeds to step S9I. In step 9I, the reading unit 240 refers to the backup memory 400 based on the key data (KD) as the search target (step S9I). Thereafter, the reading unit 240 determines whether or not key data which is the same as the key data (KD) as the search target is stored in the referred backup memory 400 (step 9J). Here, when the same key data as the key data (KD) as the search target is stored in the backup memory 400, the reading unit 240 reads an entry address (EA) associated with this key data. Thereafter, the reading unit 240 outputs the entry address (EA) read from the backup memory 400 to the output unit 260 (step S9H). On the other hand, when the same key data as the key data (KD) as the search target is not stored in the backup memory 400, the reading unit 240 determines "no consistent data" (step S9K). That is, "no consistent data" means that the same key data (KD) as the key data (KD) as the search target has not been written in the semiconductor device 10 yet. When the reading unit 240 determines "no consistency data", the read processing is terminated.

Here, the narrowing unit 270 may be provided between the reading unit 240 and the verifying unit 250 (see FIG. 1). That is, it is also possible to perform a process of narrowing down the number of address candidates using the narrowing unit 270 before the above-described step S9F. To be more specific, a plurality of entry addresses is sometimes read by the reading unit 240 in the read processing according to the present invention. In this case, it is possible to uniquely determine the entry address corresponding to the key data as the search target by collating the verification memory 300 for each of the plurality of entry addresses. However, there is a risk that delay in the read processing is caused by referring to the verification memory 300 one by one if there are a large number of entry addresses read by the reading unit 240. Therefore, the narrowing unit 270 is arranged between the reading unit 240 and the verifying unit 250. Then, the process of narrowing down a smaller number of candidates from the plurality of entry addresses read by the reading unit 240 is performed by the narrowing unit 270, and the narrowed entry addresses are sent to the verifying unit 250. As a result, the number of times of referring to the verification memory 300 performed by the verifying unit 250 decreases, and thus, it is possible to achieve an increase in speed of the search processing. Specific examples of the narrowing unit 270 will be described in detail later with reference to FIGS. 14 and 15.

Next, the read processing performed by the reading unit 240 and the verifying unit 250 will be described with specific examples with reference to FIGS. 10 and 11.

First, FIG. 10 illustrates an example of the basic read processing. In the example illustrated in FIG. 10, key data (KD) having a value "00_02_02_03_04_05_06_07_08_09_0A_0B_0C_0D_0E_0F_10_FF" is input to the semiconductor device 10 as a search target. When the key data (KD) as the search target is input to the semiconductor device 10, the dividing unit 220 divides the key data (KD) into a plurality of pieces of divided data. In the example illustrated in FIG. 10, the dividing unit 220 divides the 144-bit key data (KD) into eighteen pieces of divided data in a unit of 8 bits. Thus, each divided data has a value of 8 bits. In the example illustrated in FIG. 10, the key data (KD) is divided into the eighteen pieces of divided data, that is, "00", "02", "02", "03", "04", "05", "06", "07", "08", "09", "0A", "0B", "0C", "0D", "0E", "0F", "10", and "FF".

Thereafter, the reading unit 240 accesses the memory spaces (D) of the separate memories 110a to 110m using the divided data, generated by the dividing unit 220, as an address and reads the entry addresses (EA). As illustrated in FIG. 10, the reading unit 240 first allocates the first divided data "00" to the first separate memory 110a, designates a memory address (MA) "00" of the first separate memory 110a by referring to the first divided data "00", and accesses a memory space (D) specified by this memory address (MA) "00". Since the entry address (EA) "00" is stored in the accessed memory space (D), the reading unit 240 reads this entry address (EA) "00". Similarly, the reading unit 240 accesses the memory space (D) of the second separate memory 110b using the second divided data "02" as an address and reads the entry address (EA) "01". The reading unit 240 executes such processing for the entire divided data and separate memory. In the example illustrated in FIG. 10, an entry address "00" is read from the first separate memory 110a, an entry address "01" is read from the second separate memory 110b, an entry address "02" is read from the third separate memory 110c, and an entry address "FE" is read from the eighteenth separate memory 110m. With respect to the other separate memories, no entry address is stored in the corresponding memory space (D), and the reading unit 240 determines as "no search result".

In this manner, there is the case where the plurality of entry addresses, for example, "00" "01" "02", and "FE", may be read in the read processing according to the present invention. In such a case, it is difficult to uniquely determine which entry address corresponds to the key data as the search target. Therefore, the process of verifying whether or not a correct entry address is included among candidates of the plurality of entry addresses "00" "01" "02" and "FE", read by the reading unit 240, is performed by the verifying unit 250.

To be more specific, the verifying unit 250 accesses the verification memory 300 using the plurality of entry address candidates "00" "01" "02" and "FE" read by the reading unit 240 as keys as illustrated in FIG. 10. The key data (KD) is stored in the verification memory 300 in association with the entry address (EA) on a one-to-one basis. Accordingly, the verifying unit 250 can read the key data (KD) corresponding to the candidates of the entry address (EA) "00" "01" "02" and "FE" from the verification memory 300. Then, the verifying unit 250 compares each piece of the key data (KD) read from the verification memory 300 with the key data (KD) as the search target, and verifies whether or not the both are consistent with each other. In the example illustrated in FIG. 10, key data (KD) such as "00_02_02_03_04_05_06_07_08_09_0A_0B_0C_0D_0E_0F_10_FF" is stored in a storage area associated with the entry address "02" in the verification memory 300. The key data (KD) is consistent with the key data (KD) as the search target. Therefore, the verifying unit 250 can determine that the entry address (EA) corresponding to the key data (KD) as the search target is "02". Thus, the verifying unit 250 outputs the entry address (EA) "02" corresponding to key data (KD) as the search target together with consistency information between both pieces of the key data (KD). As a result, the entry address (EA) corresponding to the key data (KD) as the search target can be uniquely determined.

On the other hand, as a result of the verifying unit 250 referring to the verification memory 300, it is determined that there is no candidate corresponding to the key data (KD) as the search target among the entry address candidates read by the reading unit 240 in some cases. Such an example is illustrated in FIG. 11.

In the example illustrated in FIG. 11, a value such as "00_02_02_03_04_05_05_07_08_09_01_0B_0C_0D_0E_0F_10_FF" is input as the key data (KD) as the search target. The dividing unit 220 divides the input key data (ED) into eighteen pieces. In addition, the reading unit 240 allocates the plurality of pieces of divided data, respectively, to the plurality of separate memories 110a to 110m constituting the search memory mat 100. In addition, the reading unit 240 accesses the memory space (D) of each of the separate memories 110a to 110m using each divided data as an address, and reads the entry addresses (EA) stored therein. In the example of FIG. 11, in the example of FIG. 10, an entry address "00" is read from the first separate memory 110a, an entry address "01" is read from the second separate memory 110b, an entry address "02" is read from the third separate memory 110c, and an entry address "FE" is read from the eighteenth separate memory 110m. Thereafter, the verifying unit 250 refers to the verification memory 300 and reads the key data (KD) associated with the entry address candidate using the candidate of this entry address (EA) read by the reading unit 240. Then, the verifying unit 250 compares the plurality of pieces of key data (KD) read from the verification memory 300 with the key data (KD) as the search target, and determines whether or not the both are consistent with each other. However, the verification memory 300 does not store key data (KD) consistent with the key data (KD) as the search target in the example of FIG. 11. Thus, the verifying unit 250 determines as "inconsistency".

Meanwhile, there is a case where it is difficult to write the entry address in the separate memory because collisions may occur in all separate memories when writing an entry address corresponding to key data as illustrated in FIG. 7. When such whole collision occurs, it is configured such that all the collided pieces of key data (KD) and the entry addresses (EA) corresponding thereto are written in the backup memory 400 in the present invention (see FIG. 7). Therefore, even when it is determined as "inconsistency" in the verifying unit 250, the key data (KD) may be recorded in the backup memory 400 in some cases as illustrated in FIG. 11. Thus, the reading unit 240 searches the backup memory 400 to investigate whether or not key data consistent with the key data as the search target is stored when it is determined as "inconsistency" as illustrated in FIG. 11. Here, the key data consistent with the key data as the search target is stored in the backup memory 400, and an entry address corresponding thereto is "FF" in the example of FIG. 11. Therefore, the reading unit 240 can determine that the entry address corresponding to the key data as the search target is "FF" by searching the backup memory 400. Thus, the reading unit 240 outputs the entry address "FF" as the search result.

The semiconductor device 10 according to the present invention can write key data (KD) as many as the number of entries of the search memory mat 100 at the maximum by adopting the above-described writing method and reading method. In the example illustrated in FIG. 5 and the like, it is possible to register 256 pieces of key data (KD) at the maximum since the total entry number of the semiconductor device 10 is 256 entries. Therefore, it is possible to dramatically improve the write capacity of the semiconductor device 10.

Next, the encoding processing of key data (KD) will be described with reference to FIGS. 1 to 3, 8, 12 and 13.

As described above, the semiconductor device 10 according to the present invention does not write the entry address in the memory space when the collision occurs in the write processing of the entry address (EA). Here, if there is the deviation in the key data (KD) as the write target, there arises a problem that a data collision frequency increases and the number of unsearchable data strings increases. The data deviation is generated when almost the same data items are continuously written in the same search memory mat 100, for example, in a case where identification (ID) numbers and Internet Protocol (IP) addresses are continuously written in descending order. Accordingly, the probability of generation of collisions of entry addresses increases in the search memory mat 100. For example, when considering that key data (KD) "00_01_02_04" is input continuously to key data (KD) "00_01_02_03", only the last 1 bit is different between values of the two pieces of key data (KD). Thus, it is difficult to write the entry address to the end when performing the write processing of the latter key data (KD). Therefore, it is preferable to prevent such data deviation.

Therefore, the semiconductor device 10 according to the present invention includes an encoding circuit 500 configured to encode key data (KD) as illustrated in FIGS. 1 and 2. In the write processing, the encoding circuit 500 encodes the key data (KD) as the write target input to the control circuit 200 before the key data is divided by the dividing unit 220 (FIG. 3: Step S2). Similarly, in the read processing, the encoding circuit 500 encodes the key data (KD) as the search target input to the control circuit 200 before the key data is divided by the dividing unit 220 (FIG. 8: step S7). The encoding referred to herein includes a process of spreading (dispersing) values of the key data by a predetermined algorithm or rearranging the order of the values of the key data. As described above, even when almost the same key data items are successively input, it is possible to eliminate the deviation of data to be written in the search memory mat 100 by encoding these key data items. If the data deviation is eliminated, it is possible to reduce the possibility of generation of the collision in the search memory mat 100. As a result, there is a high possibility that the data search can be accurately performed. Incidentally, the encoding circuit 500 encodes the key data (KD) as the write target and the key data (KD) as the search target using exactly the same algorithm. Accordingly, the key data (KD) as the write target and the key data (KD) as the search target can be matched.

Figure 12:
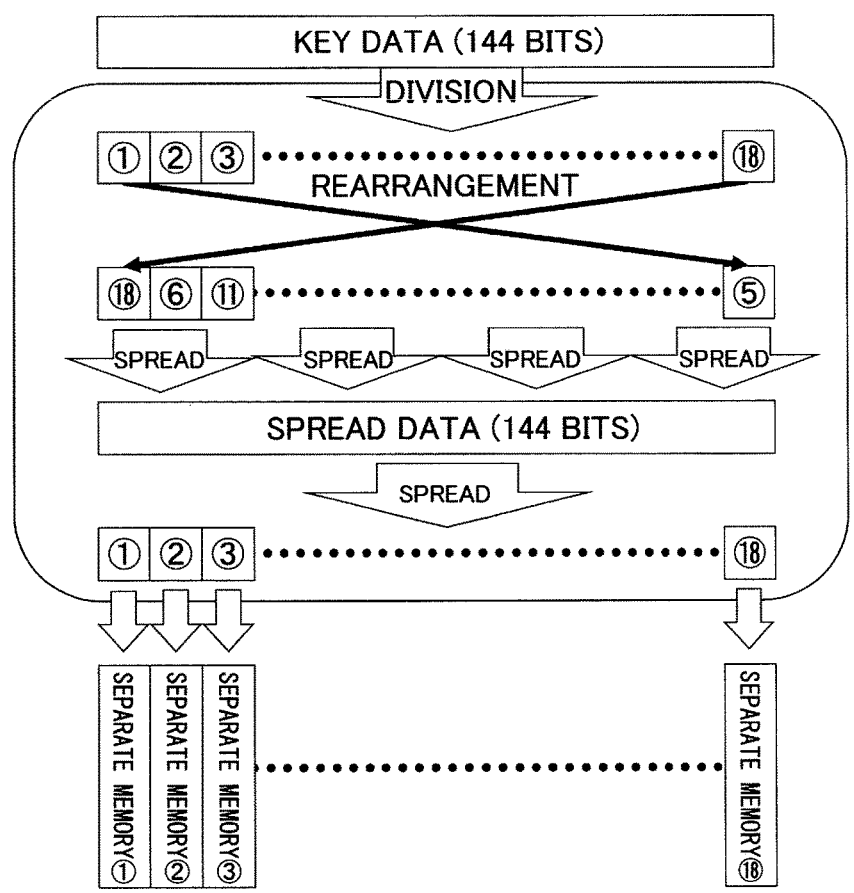
FIG. 12 illustrates an example of encoding processing.

FIG. 12 conceptually illustrates an example of the encoding processing executed by the encoding circuit 500. As illustrated in FIG. 12, the encoding circuit 500 divides key data (144 bits) as write target/search target into a plurality of pieces of divided data (1 to 18 pieces). The division processing at this time may be performed in the same manner as the above-described processing performed by the dividing unit 220. Thereafter, the encoding circuit 500 rearranges positions of the plurality of pieces of divided data (1 to 18 pieces). The rearrangement processing at this time is performed based on a certain algorithm. Thereafter, the encoding circuit 500 spreads (disperses) values of the plurality of pieces of rearranged divided data. The spread processing of the values of the divided data can be performed based on a known encoding algorithm (encryption algorithm). For example, it is preferable that the key data (KD) that has been input first be converted to a different value while maintaining the bit number by performing the spread processing. In the example illustrated in FIG. 12, both the first key data (KD) and the data after having been subjected to the spread processing (spread data) are assumed to be 144 bits of data.

As described above, the encoding circuit 500 can encode the key data (KD), for example, through the combination of rearrangement processing and spread processing. The encoded key data (spread data) is input to the dividing unit 220 of the control circuit 200 (see FIGS. 1 and 2). Thereafter, the control circuit 200 divides the spread data as usual to generate a plurality of pieces of divided data, and accesses the separate memories constituting the search memory mat 100 using the respective pieces of divided data as addresses as illustrated in FIG. 12. Then, the control circuit 200 performs the process of writing the entry address (EA) to the accessed separate memory, or the process of reading the entry address (EA) from the accessed separate memory.

Figure 13:
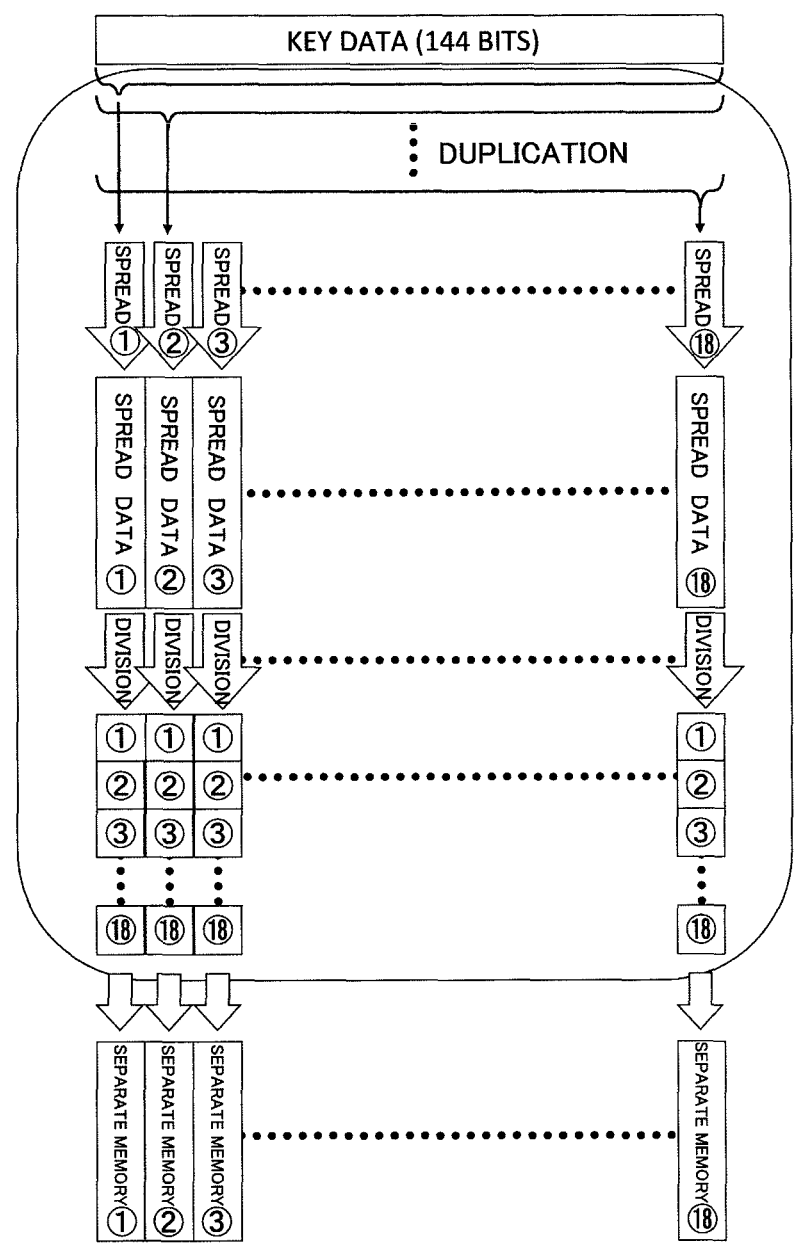
FIG. 13 illustrates another example of the encoding processing.

FIG. 13 conceptually illustrates another example of the encoding processing executed by the encoding circuit 500. As illustrated in FIG. 13, the encoding circuit 500 duplicates key data (144 bits) as write target/search target. When there are eighteen separate memories, for example, the encoding circuit 500 duplicates eighteen pieces of key data (KD) in accordance with the number of separate memories as illustrated in FIG. 13. The plurality of pieces of duplicated key data (KD) has the same value. Thereafter, the encoding circuit 500 performs the spread processing based on different spread algorithms for the plurality of pieces of key data (KD) having the same value. For example, eighteen kinds of spread algorithms are prepared since the eighteen pieces of key data (KD) are duplicated. Accordingly, spread data having different values can be obtained. In this manner, the encoding circuit 500 may generate the plurality of (the number corresponding to the number of separate memories) pieces of spread data from one piece of key data (KD).

As described above, the encoding circuit 500 can encode the key data (KD), for example, through the combination of duplication processing and spread processing. The plurality of pieces of spread data is input to the dividing unit 220 of the control circuit 200 (see FIGS. 1 and 2). Thereafter, the control circuit 200 divides each of the plurality of pieces of spread data and generates a plurality of pieces of divided data from each spread data as illustrated in FIG. 13. In addition, the control circuit 200 accesses the separate memories constituting the search memory mat 100 using the respective pieces of divided data as addresses. Then, the control circuit 200 performs the process of writing the entry address (EA) to the accessed separate memory, or the process of reading the entry address (EA) from the accessed separate memory.

In this manner, it is possible to eliminate the deviation of the data written in the search memory mat 100 by providing the encoding circuit 500 and encoding the key data (KD) as the write target. If the data deviation is eliminated, it is possible to reduce the possibility of generation of the collision in the search memory mat 100. As a result, there is a high possibility that the data search can be accurately performed.

Next, the process of narrowing down the candidates of the entry address (EA) will be described with reference to FIGS. 14 and 15.

Figure 14:
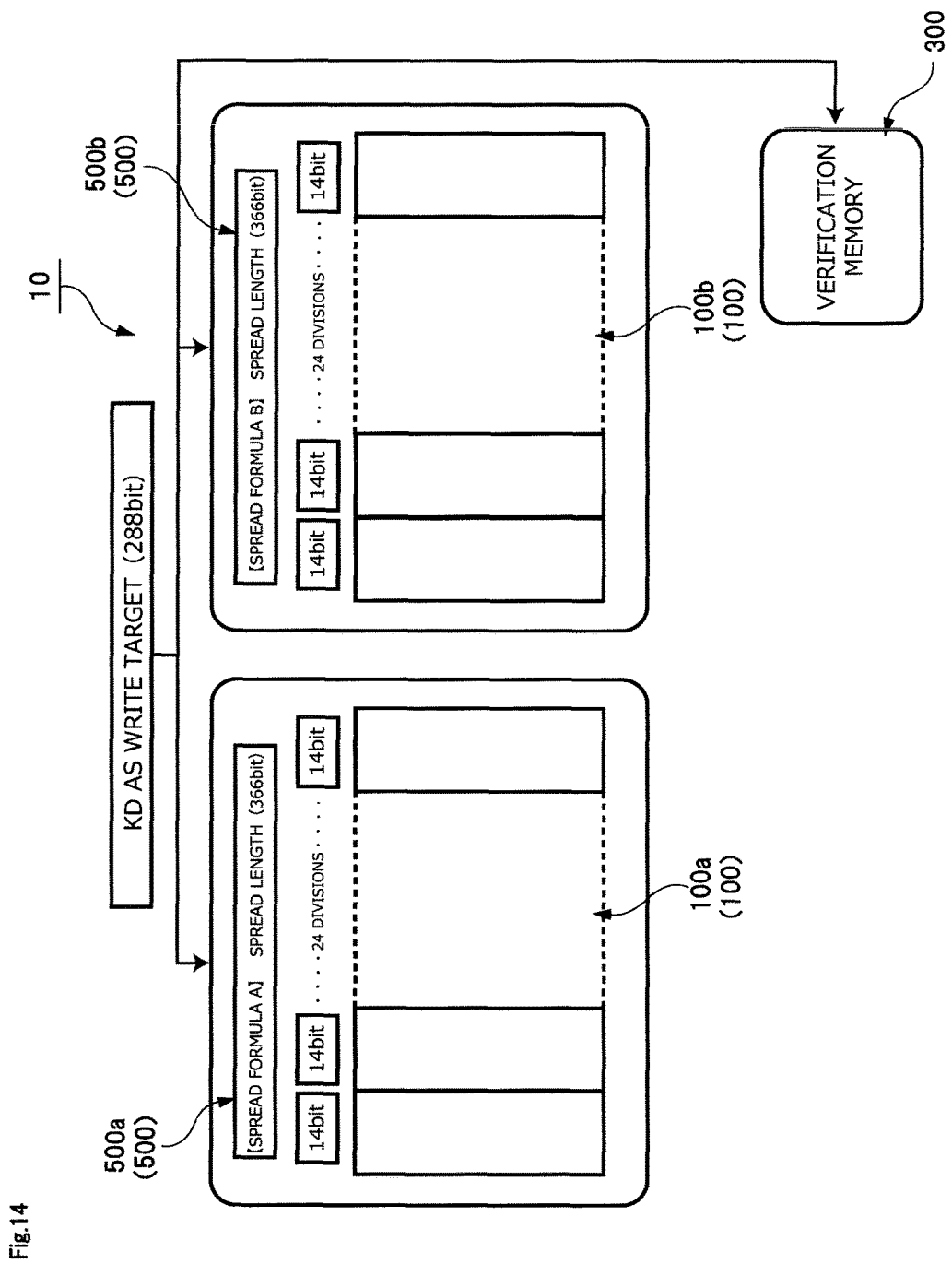
FIG. 14 illustrates another example of the write processing.
Figure 15:
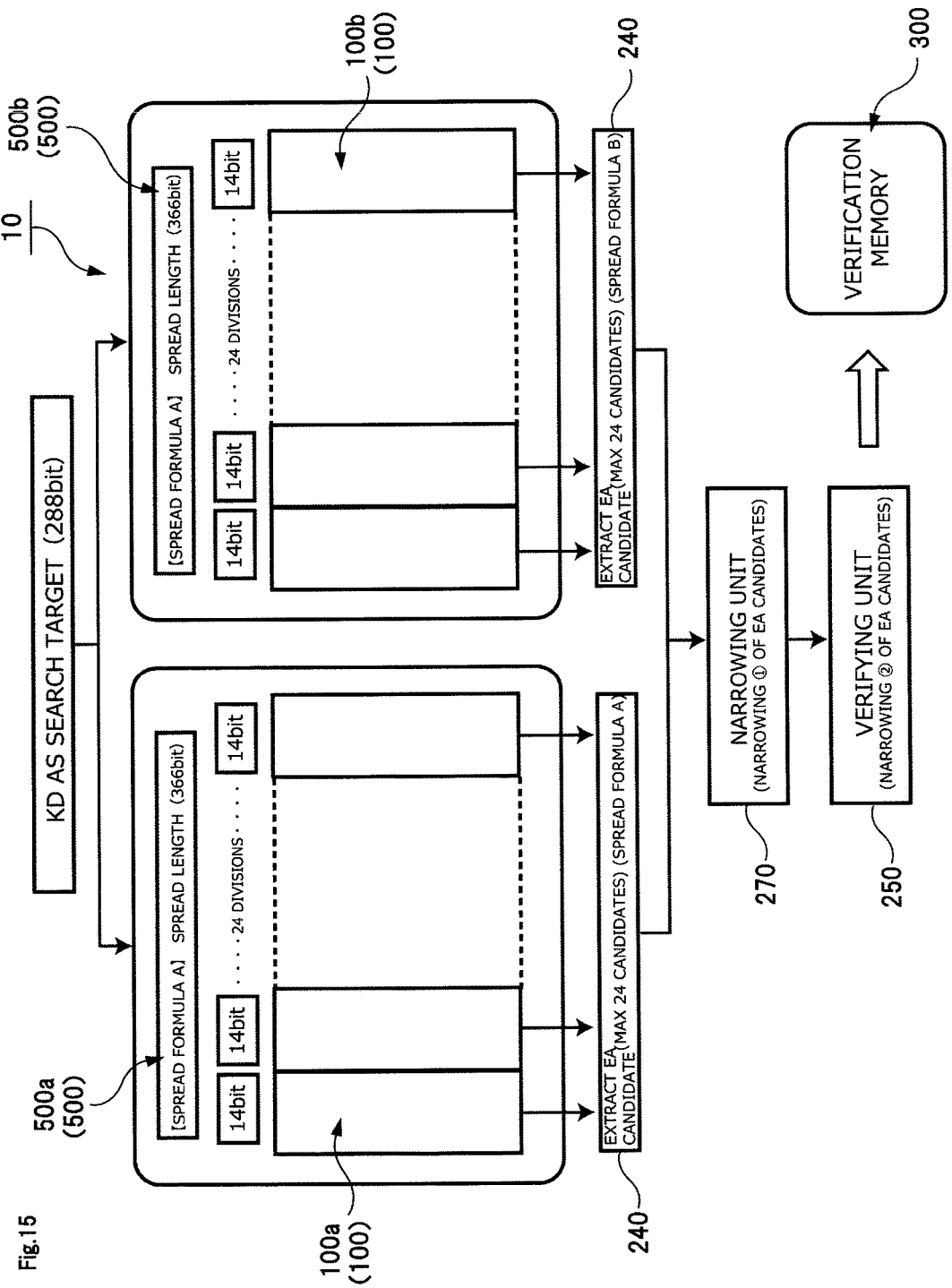
FIG. 15 illustrates an example of read processing in which narrowing of an entry address candidate is performed.

FIGS. 14 and 15 illustrate examples of the process of narrowing down candidates which are highly likely to correspond to key data (KD) as a search target from among a plurality of candidates of entry address (EA) read by the reading unit 240 in the read processing of the entry address (EA). As described above, the reading unit 240 reads the plurality of candidates of entry address (EA) from the search memory mat 100 in the reading method according to the present invention. Even if there is the plurality of candidates of the entry address (EA), it is possible to uniquely determine the entry address (EA) corresponding to the key data (KD) as the search target through the one-by-one collation using the verification memory 300 as described above. However, if the number of candidates of the entry address (EA) is large, the number of times for collation with the verification memory 300 increases so that there is a possibility that a delay occurs in the read processing. Thus, it is preferable to further narrow down candidates from among the plurality of candidates of entry address (EA) read by the reading unit 240 to reduce the number of times of collation with the verification memory 300.

FIG. 14 illustrates an outline of a process of writing an entry address (EA) corresponding to key data (KD) as a write target in the semiconductor device 10. As illustrated in FIG. 14, the search memory mat 100 for writing of one piece of key data (KD) is composed of a first search memory mat 100*a* and a second search memory mat 100*b*. That is, the key data (KD) as the write target is input and written into both the first search memory mat 100*a* and the second search memory mat 100*b*. In addition, the encoding circuit 500 is composed of a first encoding circuit 500*a* provided for the first search memory mat 100*a* and a second encoding circuit 500*b* provided for the second search memory mat 100*b*. The first encoding circuit 500*a* and the second encoding circuit 500*b* have different encoding methods (Spread Formulas). That is, the first encoding circuit 500*a* spreads the key data (KD) as the write target by Spread Formula A, whereas the second encoding circuit 500*b* spreads (KD) as the write target by Spread Formula B.

For example, when 288-bit key data (KD) is input into the semiconductor device 10 as illustrated in FIG. 14, a unique entry address (EA) is allocated to this key data (KD), and the correspondence therebetween is recorded in the verification memory 300. In addition, the key data (KD) to which the entry address (EA) has been allocated is input to both the first encoding circuit 500*a* and the second encoding circuit 500*b*. The respective encoding circuits 500*a* and 500*b* are common in terms of spreading the key data (KD) as the write target from a 288-bit length to a 366-bit length by a predetermined algorithm. In this manner, by increasing the bit length of the key data, it is possible to reduce the possibility of a whole collision in the write processing. On the other hand, the respective encoding circuits 500*a* and 500*b* have the different key data spread methods. Thus, values of the spread key data output from the respective encoding circuits 500*a* and 500*b* are totally different from each other although the key data having the same value (288 bits) is input to each of the encoding circuits 500*a* and 500*b*. However, the bit length (366 bits) of the spread key data output from each of the encoding circuits 500*a* and 500*b* is common. Thereafter, the semiconductor device 10 divides the key data spread by the first encoding circuit 500*a* into twenty-four pieces, writes an entry address (EA) at an appropriate place in the first search memory mat 100*a* using each divided key data as an address. At the same time, the semiconductor device 10 divides the key data spread by the second encoding circuit 500*a* into twenty-four pieces, writes an entry address (EA) at an appropriate place in the second search memory mat 100*b* using each divided key data as an address. The write processing of the entry address (EA) herein is the same as the above-described method. In this manner, the semiconductor device 10 uses the two different encoding circuits 500*a* and 500*b* to encode one piece of key data (KD) by the different encoding methods, and writes the two pieces of encoded key data in the two different search memory mats 100*a* and 100*b*, respectively, in the embodiment of FIG. 14.

First, an outline of a process of reading an entry address (EA) corresponding to key data (KD) as a search target from the semiconductor device 10 is illustrated in FIG. 15. In an embodiment illustrated in FIG. 15, the control circuit 200 of the semiconductor device 10 further includes the narrowing unit 270. The narrowing unit 270 is provided between the reading unit 240 and the verifying unit 250. The narrowing unit 270 has a function of further narrowing down candidates from among candidates of entry address (EA) read from the first search memory mat 100*a* and the second search memory mat 100*b* by the reading unit 240. The narrowing unit 270 sends the narrowed-down candidates of the entry address (EA) to the verifying unit 250. Thus, the verifying unit 250 only needs to perform collation in the verification memory 300 for the candidates narrowed-down by the narrowing unit 270. Therefore, it is possible to increase the speed of the search processing of the entry address (EA).

To be more specific, 288-bit key data (KD) as a search target is input to the semiconductor device 10. The key data (KD) as the search target is input to each of the first encoding circuit 500*a* and the second encoding circuit 500*b* and is spread to 366 bits. Thereafter, the two pieces of spread key data (KD) are divided into twenty-four pieces, respectively. The reading unit 240 accesses a memory space of the first search memory mat 100*a* using the divided key data obtained through the first encoding circuit 500*a* as an address and reads an entry address (EA) stored therein. Accordingly, one or a plurality of candidates of the entry address (EA) is extracted from the first search memory mat 100*a*. The first search memory mat 100*a* is constructed using twenty four separate memories. Thus, the maximum number of candidates of the entry address (EA) that can be read from the first search memory mat 100*a* is twenty four. At the same time, the reading unit 240 accesses a memory space of the second search memory mat 100*b* using the divided key data obtained through the second encoding circuit 500*b* as an address, and reads an entry address (EA) stored therein. Accordingly, one or a plurality of candidates of the entry address (EA) is extracted from the second search memory mat 100*b*. The maximum number of candidates of the entry address (EA) that can be read from the second search memory mat 100*b* is also twenty four.

Here, the reading unit 240 sends each of the candidates of the entry address (EA) read from the first search memory mat 100*a* and the second search memory mat 100*b* to the narrowing unit 270. Here, the narrowing unit 270 compares the candidates of the entry address (EA) read from the first search memory mat 100*a* with the candidates of the entry address (EA) read from the second search memory mat 100*b*, and extracts common candidates of the entry address (EA). For example, when "01", "02", "03", and "04" are included among the candidates of the entry address (EA) read from the first search memory mat 100*a*, and "03", "04", "05", and "06" are included among the candidates of the entry address (EA) read from the second search memory mat 100*b*, the narrowing unit 270 extracts the entry address candidates of "03" and "04" which are common therebetween. Thereafter, the narrowing unit 270 transfers the candidates of the entry address that have been narrowed down in this manner to the verifying unit 250.

The verifying unit 250 performs collation with the verification memory 300 for the candidates of the entry address (EA) received from the narrowing unit 270. That is, the verifying unit 250 accesses the verification memory 300 using the candidates of the entry address (EA) as a key to read key data (KD) stored in association with the entry address (EA), and verifies whether or not the read key data (KD) is consistent with the key data (KD) input as the search target. Then, when the key data read from the verification memory 300 is consistent with the key data as the search target, the semiconductor device 10 can output the entry address (EA) corresponding to the key data as a search result.

It is possible to reduce the number of times that the verifying unit 250 performs the collation with the verification memory 300 by providing the narrowing unit 270 between the reading unit 240 and the verifying unit 250 as described above. For example, when "01", "02", "03", and "04" are included among the candidates of the entry address (EA) read from the first search memory mat 100*a*, and "03", "04", "05", and "06" are included among the candidates of the entry address (EA) read from the second search memory mat 100*b* in a case where the narrowing unit 270 is not provided, the verifying unit 250 needs to perform collation with the verification memory 300 at least four times. On the other hand, it is possible to narrow down the candidates of the entry address to two ("03" and "04") if the narrowing unit 270 is provided. The verifying unit 250 only needs to perform the collation with the verification memory 300 twice by providing the narrowing unit 270. Therefore, it is possible to implement the increase in speed of the search processing.

Incidentally, the process of narrowing down the entry address candidates is not limited to the above-described mode. That is, it is enough that it is possible to make the number of entry address candidates collated with the verification memory 300 by the verifying unit 250 be smaller than the number of entry address candidates read by the reading unit 240 by performing the narrowing processing. In this manner, any form can be adopted as long as the number of entry address candidates can be reduced by the narrowing unit 270.

Next, a description will be given regarding a method example of write processing in which data deviation is unlikely to occur with reference to FIGS. 16 to 18.

As described with reference to FIGS. 5 to 7, the semiconductor device 10 according to the present invention divides the key data as the write target into a plurality of pieces of divided data, then, sequentially allocates the respective pieces of divided data to the plurality of separate memories 110*a*, 110*b*, and so on, constituting the search memory mat 100, and sequentially writes the entry addresses (EA) corresponding to the divided data. At this time, in general, the write processing is performed sequentially from a head of key data to an end thereof such that the write processing is performed starting from the first divided data, and then, the second, the third, and the subsequent divided data. In the semiconductor device 10 according to the present invention, however, the write processing is terminated without performing the subsequent write processing when the writing of the entry address is succeeded as described above. Thus, when the write processing is started from the first divided data uniformly for the entire key data as the write target, the access is concentrated on the first separate memory 110*a*. In addition, when the write processing is started from the head portion uniformly for the entire key data as the write target, the writing of the entry address is concentrated on the separate memory of the first half portion of the search memory mat 100 and a free area is increased in the separate memory of the second half portion. When a deviation occurs in a data-written area in the search memory mat 100 in this manner, there is a risk that the number of collisions increases at the time of write processing so that a delay occurs in the write processing or the accuracy of the read processing deteriorates so that a delay occurs in the read processing. Therefore, method examples of the write processing in which the data deviation hardly occurs will be described hereinafter.

When write processing is performed in a method illustrated in FIG. 16, key data is divided into key data to perform the processing from the head side and key data to perform the processing from the end side. To be more specific, key data as a write target in (1) is subjected to spread and encoding and divided into eighteen pieces of divided data, and then, the write processing is performed in ascending order from the first (head) divided data. On the other hand, key data as a write target in (2) is subjected to spread and encoding and divided into eighteen pieces of divided data, and then, the write processing is performed in descending order from the eighteenth (end) divided data. In addition, data as a write target in (3) is written in ascending order from the first (head) divided data, and data as a write target in (4) is written in descending order from the eighteenth (end) divided data. In this manner, when the key data as the write target is input, the key data is divided into one for which the writing is started from the head and one for which the writing is started from the end in the writing method of FIG. 16. Accordingly, it is possible to eliminate a deviation of data written in the search memory mat 100.

Figure 17:
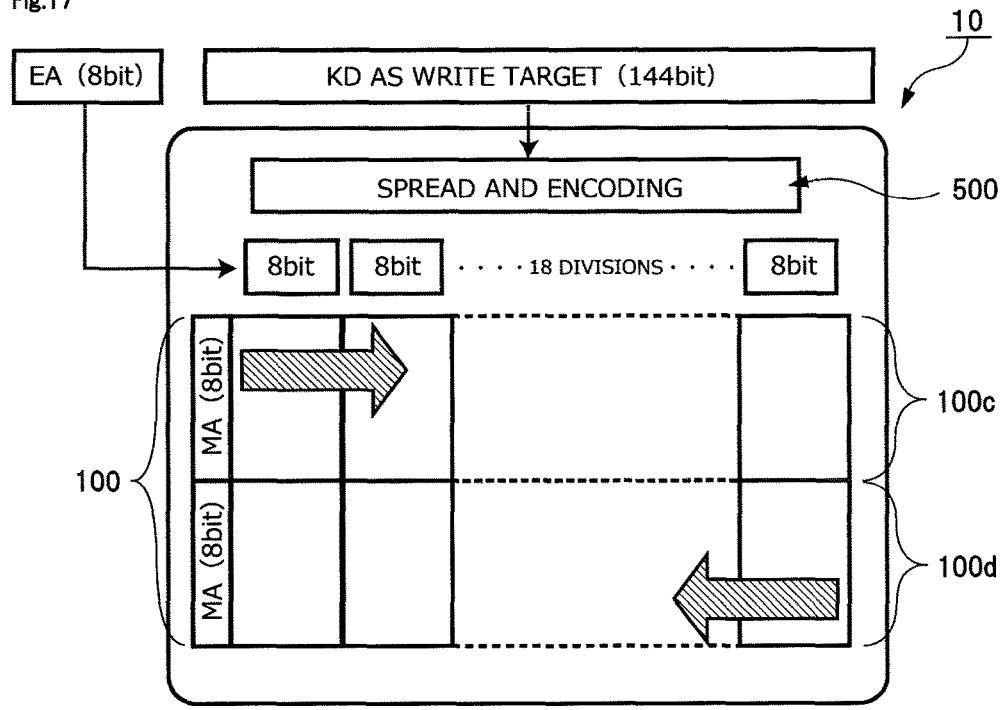
FIG. 17 illustrates a second modified example of the write processing.

In a method illustrated in FIG. 17, the search memory mat 100 is composed of two upper and lower stages. That is, the search memory mat 100 is configured by connecting the upper memory mat 100*c* and the lower memory mat 100*d* in the y-axis direction. Each of the upper memory mat 100*c* and the lower memory mat 100*d* is divided into eighteen separate memories in the x-axis direction. Here, key data as a write target in (1) is subjected to spread and encoding and divided into eighteen pieces of divided data, and then, the write processing is performed in ascending order from the first (head) divided data for the upper memory mat 100*c*. On the other hand, key data as a write target in (2) is subjected to spread and encoding and divided into eighteen pieces of divided data, and then, the write processing is performed in descending order from the eighteenth (end) divided data for the lower memory mat 100*d*. In addition, data as a write target in (3) is written in the upper memory mat 100*c* in ascending order from the first (head) divided data, and data as a write target in (4) is written in the lower memory mat 100*d* in descending order from the eighteenth (end) divided data. In this manner, the search memory mat 100 is constructed by the memory mats of the upper and lower two stages in the writing method of FIG. 17, and the key data is divided into one to be written in the upper memory mat 100*c* and one to be written in the lower memory mat 100*d* when the key data as the write target is input. Accordingly, it is possible to eliminate a deviation of data written in the search memory mat 100. Although not illustrated in FIG. 17, it is also possible to perform writing in the upper memory mat 100*c* in ascending order from the eighteenth (end) divided data and to perform writing in the lower memory mat 100*d* in ascending order from the first (head) divided data.

Figure 18:
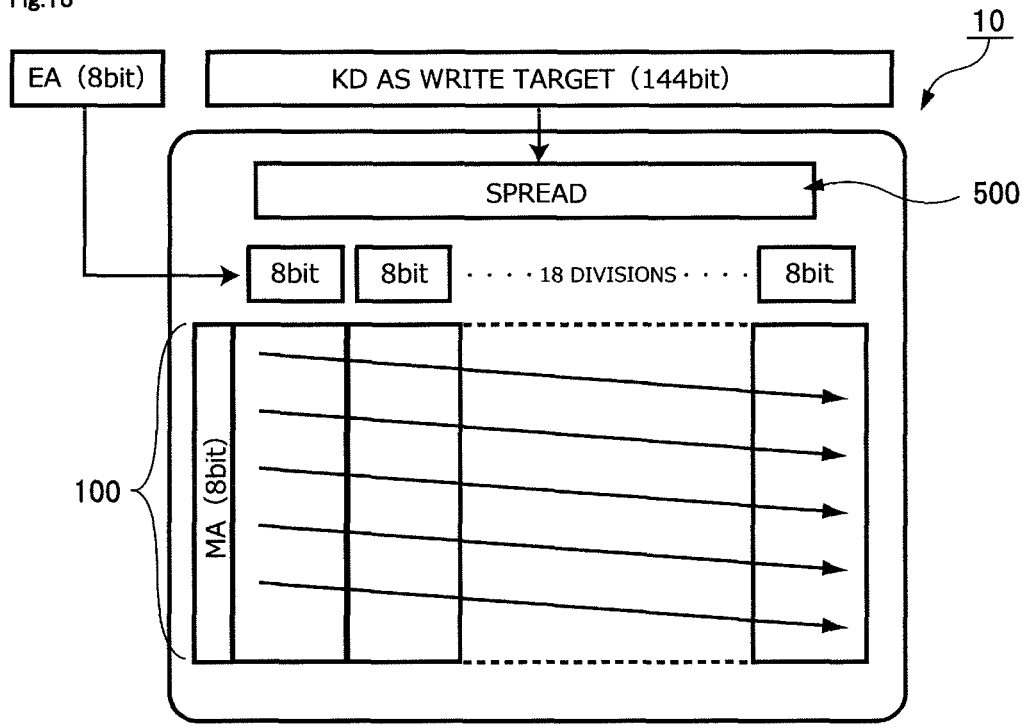
FIG. 18 illustrates a third modified example of the write processing.

In a method illustrated in FIG. 18, divided data for starting writing first is different for each key data. In FIG. 18, divided data to be subjected to write processing first is indicated by reference sign "S". To be more specific, key data as a write target in (1) is subjected to spread and encoding and divided into eighteen pieces of divided data, and then, the write processing is performed in ascending order from the first (head) divided data. In addition, key data as a write target in (2) is subjected to spread and encoding and divided into eighteen pieces of divided data, and then, the write processing is performed in ascending order from the second divided data. In addition, data as a write target in (3) is written in ascending order from the third divided data, and data as a write target in (4) is written in ascending order from the fourth divided data. In this manner, the divided data for starting the write processing first is made different when the key data as the write target is input in the writing method illustrated in FIG. 18. Accordingly, it is possible to eliminate a deviation of data written in the search memory mat 100.

In the specification of the present application, the examples illustrated in FIGS. 16 to 18 have been given as the methods of write processing in which the deviation of data hardly occurs, but the methods of write processing are not limited thereto. For example, a case is assumed where first key data and second key data are written in the semiconductor device 10. In this case, it is preferable that an entry address corresponding to k-th divided data among a plurality of pieces of divided data, obtained by dividing the first key data, be first written in the memory space when performing the write processing for the first key data. On the other hand, it is preferable that an entry address corresponding to divided data other than the k-th divided data among a plurality of pieces of divided data, obtained by dividing the second key data, be first written in the memory space when performing the write processing for the second key data. In addition, the processing may be performed in descending or ascending order, or may be performed every other or every two for divided data subsequent to the data to be processed first. In this manner, it is possible to efficiently write the entry address corresponding to the key data to the search memory mat by changing the divided data to be subjected to the write processing first for each key data as the write target.

The embodiment of the present invention has been described as above with reference to drawings in the specification of the present application in order to express the content of the present invention. However, the present invention is not limited to the embodiment described hereinbefore, and encompasses obvious modifications and improvements made by those skilled in the art based on the matters described in the specification of the present application.

REFERENCE SIGNS LIST 10 semiconductor device
100 search memory mat
100a first search memory mat
100b second search memory mat
100c upper memory mat
100d lower memory mat
110a-110c separate memories
200 control circuit
210 input unit
220 dividing unit
230 writing unit
240 reading unit
250 verifying unit
260 output unit
270 narrowing unit
300 verification memory
400 backup memory
500 encoding circuit

The invention claimed is:

1. A semiconductor device comprising:
a search memory mat in which an entry address corresponding to key data is written in a memory space specified by a memory address, wherein the memory space of the search memory mat is divided into a plurality of separate memories; and
a control circuit connected to the search memory mat, the control circuit comprising:
an input unit to which the key data is input;
a dividing unit which divides the key data input to the input unit into a plurality of pieces of divided data; and
a writing unit,
wherein the writing unit is configured to perform first write processing to allocate the plurality of pieces of divided data to the plurality of separate memories, respectively, and to sequentially write entry addresses corresponding to the plurality of pieces of divided data in memory spaces specified by memory addresses of the separate memories using each piece of the divided data as an address, and
the writing unit does not write an entry address corresponding to certain divided data in the memory space to which the entry address needs to be written when an entry address corresponding to another divided data is already written in that memory space, and ends the first write processing when an entry address corresponding to one piece of divided data among the plurality of pieces of divided data is successfully written in a memory space.

2. The semiconductor device according to claim 1 further comprising
a verification memory connected to the control circuit,
wherein the writing unit further performs second write processing of writing the key data input to the input unit and the entry address corresponding thereto in the verification memory in association with each other.

3. The semiconductor device according to claim 2 further comprising
a backup memory,
wherein, when a whole collision occurs and it is difficult to write entry addresses corresponding to all of the plurality of pieces of divided data divided from certain key data in a memory space, the writing unit writes the key data and the entry address corresponding thereto in the backup memory in association with each other.

4. The semiconductor device according to claim 1 further comprising
an encoding circuit,
wherein the encoding circuit encodes the key data input to the input unit of the control circuit based on a predetermined algorithm and inputs the encoded key data to the dividing unit.

5. The semiconductor device according to claim 4, wherein
the search memory mat is configured to include a first search memory mat and a second search memory mat,
the encoding circuit is configured to include a first encoding circuit and a second encoding circuit which have mutually different encoding algorithms, and
the writing unit of the control circuit writes an entry address corresponding to key data encoded by the first encoding circuit in the first search memory mat and writes an entry address corresponding to key data encoded by the second encoding circuit in the second search memory mat.

6. The semiconductor device according to claim 1, wherein
the writing unit writes an entry address corresponding to k-th divided data in a memory space first among a plurality of pieces of divided data obtained by dividing first key data when performing the first write processing on the first key data, and writes an entry address corresponding to divided data other than the k-th divided data in a memory space first among a plurality of pieces of divided data obtained by dividing second key data when performing the first write processing on the second key data.

7. The semiconductor device according to claim 3, wherein
the control circuit further comprises a reading unit which accesses the memory space specified by the memory address of each of the separate memories when key data as search target data is input to the input unit and the dividing unit divides the key data as the search target data into a plurality of pieces of divided data using each piece of the divided data as an address, and reads an entry address corresponding to the divided data from the accessed memory space.

8. The semiconductor device according to claim 7, wherein
the control circuit further comprises a verifying unit which reads key data corresponding to the entry address read by the reading unit from the verification memory and verifies whether or not the key data read from the verification memory is consistent with the key data as the search target data input to the input unit.

9. The semiconductor device according to claim 8, wherein
when the verifying unit determines that the key data corresponding to all the entry addresses read by the reading unit and the key data as the search target data are not consistent with each other, the reading unit reads an entry address corresponding to key data consistent with the key data as the search data from the backup memory by referring to the backup memory.

10. The semiconductor device according to claim 8 further comprising
a narrowing unit which narrows down entry addresses to an entry address candidate, from among a plurality of entry addresses, when the plurality of entry addresses is read by the reading unit and sends the entry address candidate to the verifying unit.

11. An information writing method of writing an entry address in a semiconductor device, which includes a search memory mat in which an entry address corresponding to key data being written in a memory space specified by a memory address, and a control circuit connected to the search memory mat, the memory space of the search memory mat being divided into a plurality of separate memories, the information writing method comprising:
inputting key data to the control circuit;
causing the control circuit to divide the input key data into a plurality of pieces of divided data; and
performing a first write processing to allocate the plurality of pieces of divided data to the plurality of separate memories, respectively, and to sequentially write entry addresses corresponding to the plurality of pieces of divided data in the memory space specified by memory addresses of the separate memories using each piece of the divided data as an address, wherein
an entry address is not written in the memory space when an entry address corresponding to another divided data is already written in the memory space to which the entry address corresponding to certain divided data needs to be written in the first write processing, and terminating the first write processing when an entry address corresponding to one piece of divided data among the plurality of pieces of divided data is successfully written in the memory space.

12. The information writing method according to claim 11, wherein
the semiconductor device further includes a verification memory connected to the control circuit, and
the information writing method further comprises performing a second write processing of writing the key data input to the input unit and the entry address corresponding thereto in the verification memory in association with each other.

13. An information reading method of reading an entry address written to the semiconductor device using the information writing method according to claim 12, the information reading method comprising:
inputting key data as search target data to the control circuit;
causing the control circuit to divide the input key data as the search target data into a plurality of pieces of divided data;
causing the control circuit to access the memory space specified by the memory address of each of the separate memories using each piece of the divided data as an address, and to read an entry address corresponding to the divided data from the accessed memory space; and
reading key data corresponding to the read entry address from the verification memory and verifying whether or not the key data read from the verification memory is consistent with the key data as the search target data.

* * * * *